United States Patent [19]

Eguchi et al.

[11] Patent Number: 4,683,147

[45] Date of Patent: Jul. 28, 1987

[54] METHOD OF FORMING DEPOSITION FILM

[75] Inventors: Ken Eguchi; Hiroshi Matsuda, both of Yokohama; Masahiro Haruta, Funabashi; Yukuo Nishimura, Sagamihara; Yutaka Hirai; Takashi Nakagiri, both of Tokyo, all of Japan

[73] Assignee: Canon Kabushiki Kaisha, Tokyo, Japan

[21] Appl. No.: 722,468

[22] Filed: Apr. 12, 1985

[30] Foreign Application Priority Data

| Apr. 16, 1984 | [JP] | Japan | 59-74922 |
| Apr. 16, 1984 | [JP] | Japan | 59-74923 |
| Apr. 16, 1984 | [JP] | Japan | 59-74924 |
| Apr. 16, 1984 | [JP] | Japan | 59-74925 |
| Apr. 16, 1984 | [JP] | Japan | 59-74926 |
| Apr. 16, 1984 | [JP] | Japan | 59-74927 |
| Apr. 16, 1984 | [JP] | Japan | 59-74928 |
| Apr. 16, 1984 | [JP] | Japan | 59-74929 |
| Apr. 16, 1984 | [JP] | Japan | 59-74930 |
| Apr. 16, 1984 | [JP] | Japan | 59-74931 |
| Apr. 16, 1984 | [JP] | Japan | 59-76136 |
| Apr. 16, 1984 | [JP] | Japan | 59-76137 |

[51] Int. Cl.$^4$ ............................................. B05D 3/06
[52] U.S. Cl. ..................................... 427/54.1; 427/86
[58] Field of Search ............... 427/35, 36, 53.1, 54.1, 427/55, 86; 204/157.1 R; 423/348, 349, 350

[56] References Cited

U.S. PATENT DOCUMENTS

| 3,490,961 | 1/1970 | Frieser et al. | 204/157.1 R |
| 3,661,637 | 5/1972 | Sirtl | 427/53.1 |
| 4,217,234 | 8/1980 | Ovshinsky et al. | 427/39 |
| 4,348,428 | 9/1982 | Rockley et al. | 427/86 |
| 4,363,828 | 12/1982 | Brodsky et al. | 427/86 |
| 4,374,182 | 2/1983 | Gaul et al. | 423/349 |
| 4,448,801 | 5/1984 | Fukuda et al. | 427/39 |
| 4,495,218 | 1/1985 | Azuma et al. | 427/53.1 |

Primary Examiner—John H. Newsome
Attorney, Agent, or Firm—Fitzpatrick, Cella, Harper & Scinto

[57] ABSTRACT

A method of forming a silicon-containing film deposited on a substrate, which comprises the steps of forming a gaseous atmosphere of at least one silicon compound selected from the group consisting of compounds represented by general formulas (A), (B), (C), (D), (E) and (F) in a deposition chamber containing the substrate, and applying light energy to the compound to exite and decompose the compound. The compounds of the general formulas (A)–(F) are defined below: (A) $Si_nH_mX_l$ (wherein X is a halogen atom, n is an integer of not less than 3, and m and l are integers of not less than 1, respectively, $m+l=2n$; if l is an integer of not less than 2, a plurality of X's may represent different halogen atoms) representing a cyclic silicon compound; (B) $Si_aX_{2a+2}$ (wherein X is a halogen atom and a is an integer of 1 to 6) representing a chain halogenated silicon compound; (C) $Si_bX_{2b}$ (wherein X is a halogen atom and b is an integer of 3 to 6) representing a cyclic halogenated silicon compound; (D) $Si_cX_dY_e$ (wherein X and Y are different halogen atoms, c is an integer of 3 to 6, d and e are integers of not less than 1, and $d+e=2c$) representing a cyclic halogenated silicon compound; (E) $Si_fY_gY_h$ (X and Y are different halogen atoms, f is an integer of 1 to 6, g and h are integers of not less than 1, and $g+h=2f+2$) representing a chain halogenated silicon compound; and (F) $Si_iH_jX_k$ (wherein X is a halogen atom, i, j and k are integers of not less than 1, and $j+k=2i+2$) representing a silicon compound.

20 Claims, 2 Drawing Figures

METHOD OF FORMING DEPOSITION FILM

BACKGROUND OF THE INVENTION

1. Field of the Invention

The present invention relates to a method of forming a silicon deposition film and, more particularly, to a method of forming a deposition film of amorphous silicon (to be referred to as an a-Si) or polycrystalline silicon (to be referred to as a poly-Si hereinafter) which is suitably used as a photoconductive film, a semiconductor film or an insulating film.

2. Description of the Prior Art

It is conventionally known that $SiH_4$ or $Si_2H_6$ is used as a material to deposit an a-Si film by a glow discharge or thermal energy deposition technique. More particularly, $SiH_4$ or $Si_2H_6$ is excited and decomposed by electrical or thermal energy to deposit the a-Si film on a substrate. The a-Si film is used in a variety of applications.

However, when $SiH_4$ or $Si_2H_6$ is used as a material in glow discharge deposition, the influence of high power discharge energy on a deposition film is excessively large and frequently precludes control of stable deposition conditions with good reproducibility. In particular, when a thick film of large area is deposited on a substrate, the above tendency becomes predominant.

In conventional thermal energy deposition, a high temperature is required to limit the type of usable substrate. in addition, effective hydrogen atoms bonded in a-Si are dissociated therefrom at a higher rate. As a result, desired properties of the deposition film cannot be obtained.

As is apparent from the above description, since the deposition film is formed using $SiH_4$ or $Si_2H_6$, the electrical and light characteristics thereof are not uniform, and film quality is poor. Crystal defects in the surface layer of the deposition film and defects within the bulk tend to occur. These problems must be resolved.

In order to resolve the above problems, a light energy deposition technique (i.e., a photo-CVD method) using $SiH_4$ and $Si_2H_6$ as a starting material has been recently proposed and is receiving a great deal of attention. This technique has an advantage in that an a-Si deposition film can be fomred at a low temperature, thereby greatly alleviating the conventional problems. However, since light energy has a relatively low excitation level, effective decomposition of $SiH_4$ or $Si_2H_6$ cannot be realized so that deposition rate is kept low and mass production cannot be effectively performed.

SUMMARY OF THE INVENTION

The present invention has been made to resolve the conventional problems.

It is an object of the present invention to provide a method of forming a silicon-containing deposition film of high quality at a high deposition rate.

It is another object of the present invention to provide a method of forming a high-quality silicon-containing deposition film having uniform electrical and optical characteristics even if the deposition film has a large area and is thick.

It is still another object of the present invention to provide a method of forming a silicon-containing film deposited on a substrate, comprising the steps of forming a gaseous atmosphere of at least one silicon compound selected from the compounds represented by general formulas (A), (B), (C), (D), (E) and (F) in a chamber for storing the substrate, and irradiating light energy onto the selected compound:

(A) $Si_nH_mX_l$ (wherein X is a halogen atom, n is an integer of 3 or more, and m and l are integers of 1 or more, respectively, $m+l=2n$; if l is an integer of 2 or more, a plurality of X's can represent different halogen atoms) representing a cyclic silicon compound;

(B) $Si_aX_{2a+2}$ (wherein X is a halogen atom and a is an integer of 1 to 6) representing a chain halogenated silicon compound;

(C) $Si_bX_{2b}$ (wherein X is a halogen atom and b is an integer of 3 to 6) representing a cyclic halogenated silicon compound;

(D) $Si_cX_dY_e$ (wherein X and Y are different halogen atoms, c is an integer of 3 to 6, d and e are integers of 1 or more, and $d+e=2c$) representing a cyclic halogenated silicon compound;

(E) $Si_fX_gY_h$ (wherein X and Y are different halogen atoms, f is an integer of 1 to 6, g and h are integers of 1 or more, and $g+h=2f+2$) representing a chain halogenated silicon compound; and (F) $Si_iH_jX_k$ (wherein X is a halogen atom, i, j and k are integers of 1 or more, and $j+k=2i+2$) representing a silicon compound.

It is still another object of the present invention to provide a method of forming a silicon-containing film deposited on a substrate, comprising the steps of forming a gaseous atmosphere of a cyclic silicon compound represented by general formula $Si_nH_mX_l$ (wherein X is a halogen atom, n is an integer of 3 or more, m and l are integers of 1 or more, and $m+l=2n$; if l is an integer of 2 or more, a plurality of X's may be different halogen atoms) in a chamber for storing the substrate, and irradiating excitation energy onto the cyclic silicon compound.

It is still another object of the present invention to provide a method of forming a silicon deposition film on a substrate, comprising the steps of forming a gaseous atmosphere of hydrogen and a chain halogenated silicon compound represented by general formula $Si_aX_{2a+2}$ (wherein X is a halogen atom and a is an integer of 1 to 6) in a chamber for storing the substrate, and irradiating light energy onto the chain halogenated silicon compound to excite and decompose the chain halogenated silicon compound and hydrogen.

It is still another object of the present invention to provide a method of forming a silicon-containing film on a substrate, comprising the steps of forming a gaseous atmosphere of hydrogen and a cyclic halogenated silicon compound represented by general formula $Si_bX_{2b}$ (wherein X is a halogen atom and b is an integer of 3 to 6) in a chamber for storing the substrate, and irradiation light energy onto the cyclic halogenated silicon compound to excite and decompose the cyclic halogenated silicon compound and hydrogen.

It is still another object of the present invention to provide a method of forming a silicon-containing film on a substrate, comprising the steps of forming a gaseous atmosphere of hydrogen and a cyclic halogenated silicon compound represented by general formula $Si_cX_dY_e$ (wherein X and Y are different halogen atoms, c is an integer of 3 to 6, d and e are integers of 1 or more, and $d+e=2c$) in a chamber for storing the substrate, and irradiating light energy onto the cylic halogenated silicon compound to excite and decompose the cyclic halogenated silicon compound and hydrogen.

It is still another object of the present invention to provide a method of forming a silicon-containing film on a substrate, comprising the steps of forming a gaseous atmosphere of hydrogen and a cyclic halogenated silicon compound represented by general formula $Si_fX_gY_h$ (wherein X and Y are different halogen atoms, f is an integer of 1 to 6, g and h are integers of 1 or more, and $g+h=B\ 2f+2$) in a chamber for storing the substrate, and irradiating light energy onto the cyclic halogenated silicon compound to excite and decompose the cyclic halogenated silicon compound and hydrogen.

It is still another object of the present invention to provide a method of forming a silicon-containing film on a substrate, comprising the steps of forming a gaseous atmosphere of hydrogen and a silicon compound represented by general formula $Si_iH_jX_k$ (wherein X is a halogen atom, i, j and k are integers of 1 or more and $j+k=2i+2$) in a chamber for storing the substrate, and irradiating light energy onto the silicon compound to excite and decompose the silicon compound.

The silicon-containing deposition film formed by the method of the present invention can be a crystalline or amorphous film wherein silicon bonds in the film can be any form varying from an oligomeric form to a polymeric form. In addition, the deposition film can contain hydrogen and halogen atoms of the source material.

DETAILED DESCRIPTION OF THE PREFERRED EMBODIMENTS

Figure 1:
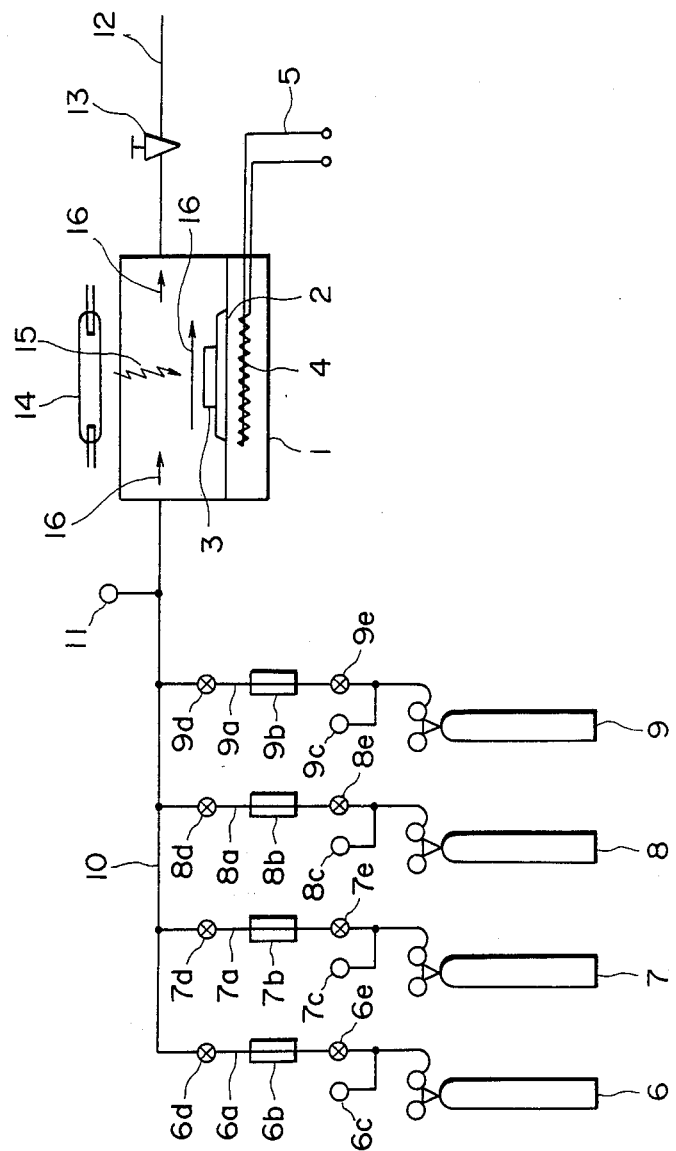
FIG. 1 is a schematic diagram showing a light energy radiation type deposition film forming apparatus according to an embodiment of the present invention.

Embodiments of the present invention are mainly explained referring a-Si deposition films in the following.

A cyclic compound represented by general formula (A) is a halogen derivative of a cyclic silicon compound (cyclic silane compound) $Si_nH_{2n}$ which can be easily manufactured and is chemically stable, wherein X is a halogen atom selected from fluorine, chlorine, bromine and iodine. When l is 1, only one type of halogen atom is represented. However, when l is 2 or more, at least one type of halogen atoms is represented.

The number n of silicon atoms is preferably 3 to 7. In order to obtain a high-quality a-Si film, n is preferably 4 to 6 and more preferably 5 or 6. When the number of silicon atoms 8 or more, silicon is easily excited and decomposed with a low energy level. In this case, although formation of a desired desposition film can be expected, the quality of the resultant film as a photoconductive film or a semiconductor film is actually degraded. In addition, it is found that defects in the surface of the film and disturbances in the bulk often occur to result in a nonuniform film. Therefore, use of such a source gas causes a failure in control of the manufacture of the deposition film.

The total number m+l of hydrogen and halogen atoms in 2n. In this case, the number l of halogen atoms is preferably smaller than the number m of hydrogen atoms.

Bonding energy, E(SiX), of the silicon atom and each halogen atom is given in an order of E(SiF)>E(SiCl)>E(SiBr)>E(SiI). As is apparent from this inequality, an Si-F bond is the most stable. It is difficult to dissociate such a bond with relatively low excitation energy such as light energy. In order to achieve the object of the present invention, the halogen atom X is preferably selected from Br and I. In particular, an Si-I bond is less stable than an Si-H bond and tends to be easily dissociated. Light-absorbing energy in the Si-I bond is shifted to a low energy level, i.e., a long wavelength range, thereby improving light decomposition efficiency.

In light energy excitation of the cyclic silicon compound represented by general formula (A), Si-Si, Si-Br and Si-I bonds which have relatively low bonding energy levels are dissociated to generate radical species such as $:SiH_2$, $:SiHX$, $:Si_2H_4$, $:Si_2H_3X$ and $:SiH_2X_2$. These radical species act to form a high-quality a-Si film upon energy excitation.

The cyclic silicon compound represented by general formula (A) can be selected from the compounds cited as follows:

(1) $H_6Si_6F_6$; (2) $H_6Si_6Cl_6$; (3) $H_6Si_6Br_6$; (4) $H_6Si_6I_6$; (5) $H_6Si_6F_4Br_2$; (6) $H_6Si_6Cl_4Br_2$; (7) $H_8Si_6F_4$; (8) $H_8Si_6Cl_4$; (9) $H_8Si_6Br_4$; (10) $H_8Si_6I_4$; (11) $H_5Si_5F_5$; (12) $H_5Si_5Cl_5$; (13) $H_5Si_5Br_5$; (14) $H_5Si_5I_5$; (15) $H_5Si_5F_3Br_2$; (16) $H_5Si_5Cl_3Br_2$; (17) $H_6Si_5F_4$; (18) $H_6Si_5Cl_4$; (19) $H_6Si_5Br_4$; (20) $H_6Si_5I_4$; (21) $H_4SiF_4$; (22) $H_4Si_4Cl_4$; and (23) $H_4Si_4Br_4$.

A chain halogenated silicon compound represented by general formula (B) is a halogen derivative of a straight or branched chain hydrogenated silicon compound (chain silane compound) $Si_aH_{2a+2}$ which can be easily manufactured and is highly stable.

In general formula $Si_aX_{2a+2}$, X is a halogen atom selected from fluorine, chlorine, bromine and iodine. The integer "a" is limited within the range between 1 and 6 because the compound is easily decomposed, but not easily vaporized and the synthesis is difficult when the integer "a" is increased. In other words, when the value "a" exceeds a predetermined value, decomposition efficiency is degraded.

The chain halogenated silicon compound represented by general formula (B) is preferably selected from the following compounds:

(24) $SiF_4$; (25) $Si_2F_6$; (26) $Si_3F_8$; (27) $Si_4F_{10}$; (28) $Si_5F_{12}$; (29) $Si_6F_{14}$; (30) $SiCl_4$; (31) $Si_2Cl_6$; (B 32) $Si_3Cl_8$; (33) $SiBr_4$; (34) $Si_2Br_6$; (35) $Si_3Br_8$; and (36) $SiI_4$.

A cyclic halogenated silicon compound represented by general formula (C) is a halogen derivative of a cyclic hydrogenated silicon compound (cyclic silane compound) $Si_bH_{2b}$ which can be easily manufactured and is highly stable. In general formula $Si_bX_{2b}$, X is a halogen atom selected from fluorine, chlorine, bromine and iodine. The integer "b" is limited to the range between 3 and 6 because the compound is easily decomposed but not easily vaporized and the synthesis is difficult and the decomposition efficiency is low when the integer "b" is increased.

Preferable cyclic halogenated silicon compounds represented by general formula (C) are given as follows:

(37) $Si_3F_6$; (38) $Si_4F_8$; (39) $Si_5F_{10}$; (40) $Si_6F_{12}$; (41) $Si_3Cl_6$; (42) $Si_4Cl_8$; (43) $Si_5Cl_{10}$; (44) $Si_6Cl_{12}$; (45) $Si_3Br_6$; and (46) $Si_4Br_8$.

A cyclic halogenated silicon compound represented by general formula (D) is a halogen derivative of a cyclic hydrogenated silicon compound (cyclic silane compound) $Si_qH_{2q}$ which can be easily manufactured and is highly stable. In general formula $Si_cX_dY_e$, X and Y are different halogen atoms selected from fluorine, chlorine, bromine and iodine. The integer "q" is limited to the range between 3 and 6 because the compound is easily decomposed but not easily vaporized and the synthesis is difficult when the integer q is increased. In other words, when the value q exceeds a predetermined value, decomposition efficiency is degraded.

Preferable cyclic halogenated silicon compounds represented by general formula (D) are given as follows:

(1) Compounds including F and Cl
$Si_3F_pCl_{6-p}$ (wherein p is an integer of 1 to 5)
$Si_4F_pCl_{8-p}$ (wherein p is an integer of 1 to 7)
$Si_5F_pCl_{10-p}$ (wherein p is an integer of 1 to 9)
(2) Compounds including F and Br
$Si_3F_pBr_{6-p}$ (wherein p is an integer of 1 to 5)
$Si_4F_pBr_{8-p}$ (wherein p is an integer of 1 to 7)
$Si_5F_pBr_{10-p}$ (wherein p is an integer of 1 to 9)
(3) Compounds including Cl and Br
$Si_3Cl_pBr_{6-p}$ (wherein p is an integer of 1 to 5)
$Si_4Cl_pBr_{8-p}$ (wherein p is an integer of 1 to 7)
$Si_5Cl_pBr_{10-p}$ (wherein p is an integer of 1 to 9)
(4) Compounds including F and I
$Si_3F_pI_{6-p}$ (wherein p is an integer of 1 to 5)
$Si_4F_pI_{8-p}$ (wherein p is an integer of 1 to 7)

The most preferable compounds among the compounds (1), (2), (3) and (4) are as follows:

(47) $Si_3F_5Cl$; (48) $Si_3F_4Cl_2$; (49) $Si_3F_3Cl_3$; (50) $Si_3F_2Cl_4$; (51) $Si_3FCl_5$; (52) $Si_4F_7Cl$; (53) $Si_4F_6Cl_2$; (54) $Si_4F_5Cl_3$; (55) $Si_4F_4Cl_4$; (56) $Si_4F_3Cl_5$; (57) $Si_4F_2Cl_6$; (58) $Si_4FCl_7$; (59) $Si_3F_5Br$; (60) $Si_3F_4Br_2$; (61) $Si_3F_3Br_3$; (62) $Si_3F_2Br_4$; (63) $Si_3FBr_5$; (64) $Si_4F_7Br$; (65) $Si_4F_6Br_2$; (66) $Si_4F_5Br_3$; (67) $Si_4F_4Br_4$; (68) $Si_4F_3Br_5$; (69) $Si_4F_2Br_6$; (70) $Si_4FBr_7$; (71) $Si_3Cl_5Br$; (72) $Si_3Cl_4Br_2$; (73) $Si_3Cl_3Br_3$; (74) $Si_3Cl_2Br_4$; (75) $Si_3ClBr_5$; (76) $Si_3F_5I$; (77) $Si_3F_4I_2$; and (78) $Si_3F_3I_3$.

A chain halogenated silicon compound represented by general formula (E) is a halogen derivative of a straight or branched chain hydrogenated silicon compound (chain silane compound) $Si_sH_{2s+2}$ which can be easily manufactured and is highly stable. In general formula (E), X and Y are different halogen atoms selected from fluorine, chlorine, bromine and iodine. The integer "s" is limited to the range between 1 and 6 because the compound is easily decomposed but not easily vaporized and the synthesis is difficult when the integer "s" is increased. In other words, when the value "s" exceeds a predetermined value, decomposition efficiency is degraded.

Preferable chain halogenated silicon compounds represented by general formula (E) are given as follows:

(1) Compounds containing F and Cl
$SiF_rCl_{4-r}$ (wherein r is an integer of 1 to 3)
$Si_2F_rCl_{6-r}$ (wherein r is an integer of 1 to 5)
$Si_3F_rCl_{8-r}$ (wherein r is an integer of 1 to 7)
$Si_4F_rCl_{10-r}$ (wherein r is an integer of 1 to 9)
(2) Compounds containing F and Br
$SiF_rBr_{4-r}$ (wherein r is an integer of 1 to 3)
$Si_2F_rBr_{6-r}$ (wherein r is an integer of 1 to 5)
$Si_3F_rBr_{8-r}$ (wherein r is an integer of 1 to 7)
$Si_4F_rBr_{10-r}$ (wherein r is an integer of 1 to 9)
(3) Compounds containing Cl and Br
$SiCl_rBr_{4-r}$ (wherein r is an integer of 1 to 3)
$Si_2Cl_rBr_{6-r}$ (wherein r is an integer of 1 to 5)
$Si_3Cl_rBr_{8-r}$ (wherein r is an integer of 1 to 7)
$Si_4Cl_rBr_{10-r}$ (wherein r is an integer of 1 to 9)
(4) Compounds containing F and I
$SiF_rI_{4-r}$ (wherein r is an integer of 1 to 3)
$Si_2F_rI_{6-r}$ (wherein r is an integer of 1 to 5)

The most preferable compounds among the compounds (1), (2), (3) and (4) are as follows:

(79) $SiF_3Cl$; (80) $SiF_2Cl_2$; (81) $SiF_3Cl$; (82) $Si_2FCl_5$; (83) $Si_2F_2Cl_4$; (84) $Si_2F_3Cl_3$; (85) $Si_2F_4Cl_2$; (86) $Si_2F_5Cl$; (87) $Si_3F_7Cl$; (88) $Si_3F_6Cl_2$; (89) $Si_3F_5Cl_3$; (90) $SiF_3Br$; (91) $SiF_2Br_2$; (92) $SiFBr_3$; (93) $Si_2F_5Br$; (94) $Si_2F_4Br_2$; (95) $Si_2F_3Br_3$; (96) $SiCl_3Br$; (97) $SiCl_2Br_2$; (98) $SiClBr_3$; (99) $SiF_3I$; and (100) $SiF_2I_2$.

In the silicon compound represented by general formula (F), the integer i preferably falls within the range of 3 to 7 and more preferably 3 to 6. The most preferable range of the integer i is 3 to 5. When the number of silicon atoms in the compound is 3 or more, bonding between adjacent silicon atoms, particularly, bonding between a given silicon atom interposed between two other silicon atoms and another silicon atom bonded to the given silicon atom is unstable at a relatively low excitation energy level and radical decomposition tends to occur. On the other hand, when the number of directly bonded silicon atoms is increased, radical decomposition is easily performed with a low excitation energy level. However, in this case, when the number of directly bonded silicon atoms is 8 or more, the quality of the resultant a-Si film is degraded.

In order to perform effective excitation and decomposition and deposit a high-quality a-Si film on the substrate, the number of silicon atoms in the compound preferably falls within the range of 3 to 7, more preferably 3 to 6, and most preferably 3 to 5.

In general formula (F), the number of halogen atom X (k) is not limited to one type of halogen but can be extended to different types of halogen. A total number of halogen atoms is determined by relation $j+i=k$. In this case, a compound having a total number of halogen atoms smaller than a total number of hydrogen atoms is preferred.

Bromine and iodine atoms are preferred as halogen atoms contained in the silicon compounds used in the method of the present invention. Of these halogen atoms, the iodine atom is preferable. This is because an Si-Br or Si-I bond (especially, the Si-I bond) is more unstable than the Si-H bond and can be easily excited and dissociated with low energy such as light energy. In addition, light-absorbing energy is shifted to a low energy level, i.e., a long wavelength range, thereby obtaining high light decomposition efficiency.

The silicon compounds used in the method of the present invention can be easily excited and decomposed with light energy to generate radicals such as :SiH$_2$, :SiHX, :Si$_2$H and :SiH$_2$X$_2$ which are excited and decomposed by light energy to obtain a high-quality a-Si film.

Typical silicon compounds used in the method of the present invention are as follows:

(101) $H_2SiBr_2$; (102) $H_2SiI_2$; (103) $H_3SiF$; (104) $H_3SiBr$; (105) $H_3SiI$; (106) $H_3SiFI$; (107) $H_2SiClI$; (108) $H_2SiBrI$; (109) $(HBr_2Si)_2$; (110) $(HI_2Si)_2$; (111) $(H_2FSi)_2$; (112) $(H_2ClSi)_2$; (113) $(H_2BrSi)_2$; (114) $(H_2ISi)_2$; (115) $H_4Si_2FI$; (116) $H_4Si_2ClI$; (117) $H_4Si_2BrI$; (118) $H_4Si_2FBr$; (119) $H_4Si_2ClBr$; (120) $H_5Si_2F$; (121) $H_5Si_2Cl$; (122) $H_5Si_2Br$; (123) $H_5Si_2I$;

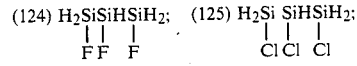

(126) $H_5Si_3Br_3$; (127) $H_5Si_3I_3$; (128) $H_4Si_3Br_4$; (129) $H_4Si_3I_4$; (130) $H_6Si_3Br_2$; (131) $H_6Si_3I_2$; (132) $H_7Si_3F$; (133) $H_7Si_3Cl$; (134) $H_7Si_3Br$; (135) $H_7Si_3I$; (136) cyc-$H_2Si_6Br_{10}$; (137) cyc-$H_6Si_6Br_6$; (138) cyc-$H_2Si_6F_4Br_6$;

(139) cyc-$H_6Si_6Cl_6$; (140) cyc-$H_6Si_6F_6$; and (141) cyc-$H_2Si_6F_{10}$.

The chamber for forming a silicon-containing deposition film is preferably kept at a reduced pressure. However, even if the chamber is kept at atmospheric or high pressure, the method of the present invention can be practiced.

Excitation energy used in the present invention is limited to light energy. The chain halogenated silicon compounds of the above-mentioned general formulas can be easily excited and decomposed at a relative low energy level such as light energy and the like to form a high-quality silicon deposition film. In this case, the method of the present invention has an advantage in that the substrate temperature can be kept at a relatively low level. Excitation energy which reaches near the substrate selectively and uniformly irradiates the material. By the use of light energy, a proper optical system can entirely illuminate the substrate to simultaneously form a film on the entire surface of the substrate. In addition, a part of the substrate can be illuminated to locally deposit a film on a desired portion of the substrate. Furthermore, by using a resist pattern, a film can be deposited on the desired pattern, thus resulting in convenience.

In the present invention, when a gaseous atmosphere of at least one of the silicon compounds represented by general formulas (A) to (F) is formed in the chamber, hydrogen radicals are produced during excitation and the decomposition reaction increases reaction efficiency. In addition, hydrogen is contained in the deposition film to decrease crystal defects of the Si bond structure. For this reason, hydrogen gas is preferably supplied to the chamber according to the method of the present invention. The silicon compounds represented by general formulas (A) to (F) produce radicals such as $SiX$, $SiX_2$, $SiX_3$, $Si_2X_2$, $Si_2X_3$, $Si_2X_4$, $Si_2X_5$, $Si_3X_3$, $Si_3X_4$, $Si_3X_5$, $Si_3X_6$, $Si_3X_7$, $SiY$, $SiY_2$, $SiY_3$, $Si_2Y_3$, $Si_2Y_4$, $Si_3Y_4$, $Si_3Y_5$, $SiXY$, $SiXY_2$, $Si_2XY_2$, $Si_2XY_3$, $Si_3XY_3$, $Si_3X_2Y_2$, $Si_3XY_4$ and $Si_3X_2Y_3$. In addition, radicals containing Si, X, Y and H which are bonded are also produced by hydrogen. When the reaction process of these radicals is performed, the resultant high-quality film has a small local level density wherein Si dangling bonds are sufficiently terminated by H or X.

At least two silicon compounds represented by general formulas (A) to (F) may be used. In this case, averaged or synergistically improved characteristics of the film characteristics expected from the compounds can be obtained.

When a compound having as a major component elements belonging to Group III or V of the Periodic Table is supplied to the chamber, a deposition film containing silicon atoms and Group III or V atoms is obtained and can be used as a functional film such as a photoconductive film and a semiconductor film in a variety of applications.

The p-type impurity elements used in the present invention are preferably Group IIIA elements such as B, Al, Ga, In and Tl, and the n-type impurity elements are preferably Group VA elements such as N, P, As, Sb and Bi. Among these impurity elements, the most preferable elements are B, Ga, P and Sb. A dose of the impurity dopant is properly determined in accordance with the desired electrical and optical characteristics and is, for example, $3 \times 10^{-2}$ to 4 atomic% for a Group IIIA impurity and $5 \times 10^{-3}$ to 2 atomic% for a Group VA impurity.

A compound containing such as impurity element is maintained in a gaseous state in atmospheric pressure at room temperature or is vaporized under deposition conditions. The compound is preferably selected for vaporizing by a proper vaporizing apparatus and is exemplified by $PH_3$, $P_2H_4$, $PF_3$, $PF_5$, $PCl_3$, $AsH_3$, $AsF_3$, $AsF_5$, $AsCl_3$, $SbH_3$, $SbF_5$, $SiH_3$, $BF_3$ $BCl_3$, $BBr_3$, $B_2H_6$, $B_4H_{10}$, $B_5H_9$, $B_5H_{11}$, $B_6H_{10}$, $B_6H_{12}$ or $AlCl_3$. One or more types of compounds containing the impurity element may be used.

The present invention will be described in detail with reference to the accompanying drawings.

FIG. 1 is a schematic diagram showing an example of an apparatus for forming an a-Si deposition film used for a photoconductive film, a semiconductor film, an insulating film or the like.

The apparatus has a deposition chamber 1. A desired substrate 3 is placed on a support 2 in the deposition chamber 1. The substrate 3 may be a conductive, semiconductive or insulating material. An insulating substrate can be generally selected from a synthetic resin (e.g., polyester, polyethylene, polycarbonate, cellulose acetate, polypropylene, polyvinyl chloride, polyvinylidene chloride, polystyrene, or polyamide) film or sheet, a glass substrate, a ceramic substrate, or a paper. The substrate 3 may be a bulk substrate wherein an electrode layer or another silicon layer is formed.

A substrate heater 4 is powered through wires 5 to heat the substrate 3. A substrate temperature is not specified, but preferably falls within the range of 50° to 150° C. and more preferably 100° to 150° C.

Gas supply sources 6 to 9 can be provided with a proper evaporator when liquid silicon compounds among the compounds represented by general formulas (A) to (F) are used. The evaporator may be of a type utilizing heating and boiling or of a type for passing a carrier gas through a source gas. The number of gas supply sources is not limited to 4, but can be changed with/without premixture of the source gases as the silicon compounds represented by general formulas (A) to (F) when hydrogen gas, a carrier gas, a dilution gas or a catalyst gas are used in accordance with the required number of silicon compounds among those represented by general formulas (A) to (F). A suffix "a" attached to each of reference numerals 6 to 9 as the gas supply sources represents a branch pipe; "b" represents a flow meter; "c" denotes a pressure meter for measuring a pressure at the high-pressure side of the meter; and "d" or "e" represents a valve for regulating a flow rate of each gas.

Source gases from the corresponding gas supply sources are mixed midway along a gas supply pipe 10 and are supplied by an exhausting apparatus to the chamber 1. A pressure meter 11 measures a pressure of a gas to be supplied to the chamber 1. A gas discharge pipe 12 is connected to a discharge unit (not shown) for decreasing a pressure in the chamber 1 or forcibly discharging the gas. A regulator valve 13 regulates the gas flow. Before the source gas is supplied to the chamber 1, the chamber 1 is evacuated to less than $5 \times 10^{-5}$ Torr and preferably less than $1 \times 10^{-6}$ Torr if the chamber 1 is to be kept at a reduced pressure. When the source gas is supplied, the chamber 1 is preferably kept at a pressure of $1 \times 10^{-2}$ to 100 Torr and preferably $1 \times 10^{-2}$ to 1 Torr.

An excitation energy source as a light energy generator 14 comprises a mercury lamp, a xenon lamp, a carbon dioxide laser, an argon ion laser or an excimer laser.

Light energy used in the present invention is not limited to ultraviolet energy, but can have any wavelength range which allows excitation and decomposition of a source gas so as to deposit a decomposed material. In addition, a case is included wherein light energy is absorbed in the source gas and the substrate and converted to thermal energy which excites and decomposes the source gas. Light 15 directed from the light energy generator 14 using a proper optical system to part or all of the area of the substrate irradiates the source gas or the like flowing in a direction indicated by an arrow 16 to excite and decompose the source gas, thereby forming an a-Si deposition film on all or part of the surface of the substrate.

According to a method of the present invention, if desired, a deposition film of any thickness varying from a thin film to a thick film can be obtained. In addition, a film area can be arbitrarily selected. The film thickness can be controlled in accordance with conventional techniques for controlling a pressure, a flow rate and a concentration of a source gas and a dose of excitation energy. For example, when an a-Si film used for a general photoconductive, semiconductor or insulating film is to be formed, a film thickness is preferably 500 to $5 \times 10^4$ Å and more preferably 1,000 to 10,000 Å.

Figure 2:
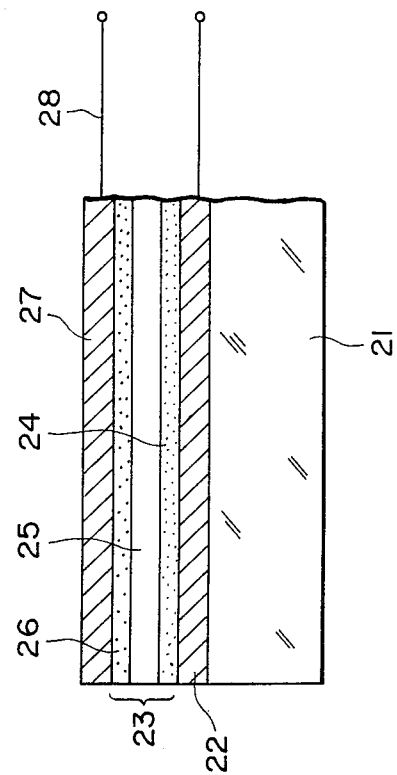
FIG. 2 is a sectional view showing a p-i-n diode manufactured by the method of the present invention.

FIG. 2 is a sectional view showing a typical p-i-n diode using an a-Si deposition film doped with an impurity element according to the method of the present invention.

This p-i-n diode comprises a substrate 21, thin electrode layers 22 and 27, and a semiconductor layer 23 having a p-type a-Si film 24, an i-type a-Si film 25 and an n-type a-Si film 26. Lead wires 28 are connected to an external electric circuit.

The substrate 21 comprises a semiconductor substrate, and preferably an insulating substrate. An Si or Ge substrate can be used as the semiconductor substrate.

The insulating substrate is selected from a synthetic resin (e.g., polyester, polyethylene, polycarbonate, cellulose acetate, polypropylene, polyvinyl chloride, polyvinylidene chloride, polystyrene or polyamide) film or sheet, a glass substrate, a ceramic substrate and a paper.

The thin electrode layers 22 and 27 are prepared such that thin films of NiCr, Al, Cr, Mo, Au, Ir, Nb, Ta, V, Ti, Pt, Pd, $In_2O_3$, $SnO_2$, ITO, ($In_2O_3 + SnO_2$) or the like are formed on the substrate by vacuum deposition, electron beam deposition or sputtering. A thickness of the electrode 22 is preferably 30 to $5 \times 10^4$ Å and more preferably 100 to $5 \times 10^3$ Å.

In order to form the n- or p-type a-Si film 26 or 24 in the a-Si semiconductor layer, an n- or p-type impurity of n- and p-type impurities at a proper dose are incorporated in the layer.

A method of forming the semiconductor layer 23 will be described in more detail.

The substrate 21 having the thin electrode layer 22 is placed on the support 2 in the deposition chamber 1, and the chamber 1 is evacuated by an exhausting apparatus (not shown) through the gas discharge pipe 12 to reduce the pressure. In this case, the deposition chamber 1 is kept at a vacuum pressure of $5 \times 10^{-5}$ Torr or less and preferably $10^{-6}$ Torr or less.

Under this reduced pressure, the heater 4 is powered to heat the substrate 21 placed on the support 3 to a predetermined temperature.

A gas mixture of an Si source gas and a p-type impurity gas at a predetermined mixing ratio is supplied to the deposition chamber 1 so as to deposit the p-type a-Si film on the thin electrode layer 22 on the substrate 21. In this case, a flow rate of the p-type impurity gas is determined by a product of the flow rate of the source gas and the doping concentration. Since a very small amount of p- or n-type impurity gas is supplied, it is preferable that the impurity gas be diluted with $H_2$ gas, and the diluted gas is stored so as to achieve easy flow control. Light energy irradiates the source gas to form the p-type a-Si layer 24 on the thin electrode layer 22 on the substrate 21.

Similarly, the Si source gas is supplied to the chamber to form the undoped layer, i.e., the i-type a-Si film 25, and an Si source gas and an n-type impurity gas are supplied to form the n-type a-Si film 26.

Finally, the thin electrode layer 27 is formed on the n-type a-Si film 26 in the same manner as the thin electrode layer 22, thereby manufacturing a p-i-n diode device.

A thickness of the p-type a-Si film falls within the range of 100 to $10^4$ Å and preferably 300 to 2,000 Å. A thickness of the i-type a-Si film falls within the range of 500 to $5 \times 10^4$ Å and preferably 1,000 to 10,000 Å. A thickness of the n-type a-Si film falls within the range of 100 to $10^4$ Å and preferably 300 to 2,000 Å. The films can be deposited on the substrate at atmospheric or high pressure as well as a reduced pressure according to the method of the present invention.

The present invention will be described in more detail by way of examples.

EXAMPLE 1

An a-Si deposition film was formed by the apparatus of FIG. 1 by using compound (1), (4), (5), (13), (17), (19) or (21) as the cyclic silicon compound represented by general formula (A).

A conductive film substrate ("#7059" available from Corning Glass Works) was placed on the support 2, and the deposition chamber 1 was evacuated by a vacuum pump. The deposition chamber 1 was kept at a reduced pressure of $10^{-6}$ Torr. The substrate was kept at each of the temperatures given in Table 1, and the halogenated silicon compound gas and hydrogen gas were supplied to the deposition chamber at flow rates of 110 SCCM and 40 SCCM, respectively. A low-pressure mercury lamp was turned on to radiate light onto the substrate at an intensity of 100 mW/cm$^2$ while the deposition chamber was kept at a substrate of 0.1 Torr, thereby forming an i-type a-Si film having a thickness of 4,000 Å. The deposition rate was 35 Å/sec.

As a comparative example, an a-Si film was formed using the $Si_2H_6$ gas. In this case, a deposition rate was 15 Å/sec.

Each resultant a-Si film sample was placed in the deposition chamber which was evacuated to a vacuum pressure of $10^{-6}$ Torr. Thereafter, aluminum was deposited on each sample at a vacuum pressure of $10^{-5}$ Torr and a deposition rate of 20 Å/sec to a thickness of 1,500 Å, thereby forming a comb-shaped Al gap electrode (having a length of 250$\mu$ and a width of 5 mm). A photocurrent (AM1, 100 mW/cm$^2$) and a dark current were measured for each sample while a voltage of 10 V was being applied thereto. A photoconductivity $\sigma p$ and a ratio $\sigma p/\sigma d$ of the photoconductivity $\Sigma p$ to the dark conductivity $\Sigma d$ were calculated to evaluate the resultant a-Si films. The obtained results are shown in Table 1.

TABLE 1

| Si compound | Si$_2$H$_6$ | 1 | 4 | 5 | 13 | 17 | 19 | 21 |
|---|---|---|---|---|---|---|---|---|
| Substrate temperature (°C.) | 100 | 75 | 50 | 75 | 50 | 75 | 50 | 75 |
| σp/σd | $10^{-5}/10^{-8} = 10^3$ | $6 \times 10^4$ | $2 \times 10^4$ | $4 \times 10^4$ | $2 \times 10^4$ | $5 \times 10^4$ | $3 \times 10^4$ | $6 \times 10^4$ |
| σp(Ω·cm)$^{-1}$ | $10^{-5}$ | $4 \times 10^{-5}$ | $10^{-4}$ | $7 \times 10^{-5}$ | $9 \times 10^{-5}$ | $4 \times 10^{-5}$ | $9 \times 10^{-5}$ | $5 \times 10^{-5}$ |

As is apparent from Table 1, the a-Si films of the present invention have a high photoconductivity σp and a high ratio σp/σd as compared with the conventional film.

EXAMPLE 2

An a-Si film was formed following the same procedures as in Example 1 except that an ArF excimer laser was used as a light source, such that its light intensity was 15 mJ/pulse, and that compound (3), (9), (10), (14), (15), (20) or (23) was used. The photoconductivities σp and the ratios σp/σd of resultant a-Si films were measured. The obtained results are shown in Table 2.

TABLE 2

| Si compound | Si$_2$H$_6$ | 3 | 9 | 10 | 14 | 15 | 20 | 23 |
|---|---|---|---|---|---|---|---|---|
| Substrate temperature (°C.) | 250 | 50 | 50 | 50 | 50 | 50 | 50 | 50 |
| σp/σd | $10^{-5}/10^{-8} = 10^3$ | $3 \times 10^4$ | $5 \times 10^4$ | $5 \times 10^4$ | $2 \times 10^4$ | $6 \times 10^4$ | $5 \times 10^4$ | $2 \times 10^4$ |
| σp(Ω·cm)$^{-1}$ | $10^{-1}$ | $9 \times 10^{-5}$ | $7 \times 10^{-5}$ | $9 \times 10^{-5}$ | $9 \times 10^{-5}$ | $5 \times 10^{-5}$ | $8 \times 10^{-5}$ | $9 \times 10^{-5}$ |

EXAMPLE 3

Compound (1), (4), (5), (13), (17), (19) or (21) was used as the cyclic silicon compound represented by general formula (A), and PH$_3$ or B$_2$H$_6$ was used as an impurity compound. An a-Si deposition film doped with P (i.e., an n-type impurity) or B (i.e., a p-type impurity) was formed by the apparatus shown in FIG. 1.

A conductive film substrate ("#7059" available from Corning Inc.) was placed on the support 2, and the deposition chamber 1 was evacuated by an exhausting apparatus to a vacuum of $10^{-6}$ Torr. The substrate was kept at each of the temperatures given by Table 3, and a gas mixture of each halogenated silicon compound gas and PH$_3$ or B$_2$H$_6$ gas at a ratio of $1:5 \times 10^{-3}$ was supplied to the chamber at a flow rate of 110 SCCM. At the same time, H$_2$ gas was supplied to the chamber at a flow rate of 40 SCCM. Light from a high-pressure mercury lamp was radiated vertically onto the substrate at a light intensity of 200 mW/cm$^2$ while the chamber was kept at a vacuum of 0.1 Torr, thereby forming an impurity-doped a-Si film. A deposition rate was 35 Å/sec.

For the purpose of comparison, an a-Si film was formed using the Si$_2$H$_6$ gas. In this case, a deposition rate was 15 Å/sec.

Each resultant a-Si film sample was placed in the deposition chamber. Thereafter, aluminum was deposited on each sample at a vacuum pressure of $10^{-5}$ Torr to form a comb-shaped Al gap electrode (having a length of 250μ and a width of 5 mm). A dark current was measured for each sample while a voltage of 10 V was being applied thereto. A dark conductivity σd of each sample was calculated to evaluate the resultant a-Si films. The obtained results are shown in Table 3.

TABLE 3

| Si compound | Si$_2$H$_6$ | 1 | 4 | 5 | 13 | 17 | 19 | 21 |
|---|---|---|---|---|---|---|---|---|
| Substrate temperature | 250 | 75 | 50 | 75 | 50 | 75 | 50 | 75 |
| σd[n-type, (Ω·cm)$^{-1}$] | $8 \times 10^{-3}$ | $3 \times 10^{-1}$ | $10^{-1}$ | $2 \times 10^{-1}$ | $2 \times 10^{-1}$ | $4 \times 10^{-1}$ | $3 \times 10^{-1}$ | $3 \times 10^{-1}$ |
| σd[p-type, (Ω·cm)$^{-1}$] | $10^{-3}$ | $4 \times 10^{-2}$ | $9 \times 10^{-3}$ | $3 \times 10^{-2}$ | $3 \times 10^{-2}$ | $4 \times 10^{-2}$ | $3 \times 10^{-2}$ | $3 \times 10^{-2}$ |

As is apparent from Table 3, the a-Si films of the present invention have sufficient doping efficiency, a high dark conductivity σd as cpompared with the conventional film prepared by using Si$_2$H$_6$ gas.

EXAMPLE 4

An a-Si film was formed following the same procedures as in Example 3 except that a polyimide substrate was used and that compound (3), (9), (10), (14), (15), (20) or (23) was used as the cyclic silicon compound. The dark conductivities σd of the resultant films were measured. The obtained results are shown in Table 4.

TABLE 4

| Si compound | Si$_2$H$_6$ | 3 | 9 | 10 | 14 | 15 | 20 | 23 |
|---|---|---|---|---|---|---|---|---|
| Substrate temperature (°C.) | 250 | 50 | 50 | 50 | 50 | 50 | 50 | 50 |
| σd[n-type, | $8 \times 10^{-3}$ | $2 \times 10^{-1}$ | $3 \times 10^{-1}$ | $10^{-1}$ | $10^{-1}$ | $3 \times 10^{-1}$ | $2 \times 10^{-1}$ | $2 \times 10^{-1}$ |

TABLE 4-continued

| Si compound | Si$_2$H$_6$ | 3 | 9 | 10 | 14 | 15 | 20 | 23 |
|---|---|---|---|---|---|---|---|---|
| $(\Omega \cdot cm)^{-1}$ $\sigma d$[p-type, $(\Omega \cdot cm)^{-1}$] | $10^{-3}$ | $2 \times 10^{-2}$ | $3 \times 10^{-2}$ | $10^{-2}$ | $4 \times 10^{-3}$ | $3 \times 10^{-2}$ | $10^{-2}$ | $3 \times 10^{-2}$ |

EXAMPLE 5

Compound (1), (6), (10), (11), (14), (24), (26), (27), (30), (32), (36), (38) or (41) was used as the chain halogenated silicon compound of the above-mentioned general formula to prepare a p-i-n diode of FIG. 2 using the apparatus of FIG. 1.

A transparent conductive film 21 deposited with an ITO film 22 having a thickness of 500 Å was placed on the support 2, and a p-type a-Si film 24 (film thickess of 400 Å) doped with B in the manner as in Example 3 was formed. A low-pressure mercury lamp was used as a light source, and its light intensity was 80 mW/cm$^2$.

An i-type a-Si film 25 (film thickness of 5,000 Å) was formed following the same procedures as in the p-type a-Si film except that B$_2$H$_6$ gas flow was stopped and the deposition chamber was kept at a pressure of 0.5 Torr.

Subsequently, a P-doped n-type a-Si film 26 (film thickness of 400 Å) was formed following the same procedures as in Example 3. In this case, the light radiation conditions were the same as those for producing the p-type a-Si film. An Al electrode 27 was formed by vacuum deposition on the n-type a-Si film to a thickness of 1,000 Å, thereby preparing a p-i-n diode.

For the purpose of comparison, a p-i-n diode was formed in the same manner as described above by using Si$_2$H$_6$.

The I-V characteristics of each resultant diode element (area of 1 cm$^2$) was measured to evaluate the rectification characteristics and the photovoltaic effect. The obtained results are shown in Table 5.

As compared with the conventional case using Si$_2$H$_6$, good rectification characteristics were obtained even at a low substrate temperature according to the present invention, as is apparent from Table 5.

In addition, good light radiation characteristics could be obtained. For example, conversion efficiency was 8% or more at a light intensity of AM1 (about 100 mW/cm$^2$), a free terminal voltage was 0.9 V, and a short-circuit current was 10 mA/cm$^2$.

EXAMPLE 6

A p-i-n diode was manufactured following the same procedures as in Example 5 except that a transparent conductive film (polyester-based) was used as a substrate, compound (2), (6), (10), (13), (14), (27), (30), (34), (36), (38), (39) or (40) was used as the chain halogenated silicon compounds of the above-mentioned general formulas, and that an ArF excimer laser was used as a light source at a light intensity of 15 mJ/pulse. A rectification ratio and rectification efficiency ρ were calculated. The obtained results are shown in Table 6.

TABLE 6

| Si Compound | Si$_6$H$_6$ | 2 | 6 | 10 | 13 | 14 | 27 | 30 | 34 | 36 | 38 | 39 | 40 |
|---|---|---|---|---|---|---|---|---|---|---|---|---|---|
| Substrate temperature (°C.) | 250 | 80 | 85 | 75 | 80 | 75 | 75 | 80 | 80 | 75 | 75 | 75 | 75 |
| Rectification ratio*[1] of diode | 8.0 | 8.5 | 8.5 | 7.3 | 8.0 | 8.8 | 8.9 | 8.0 | 8.9 | 8.0 | 9.0 | 8.3 | 8.8 |
| η value*[2] of diode | 1.5 | 1.25 | 1.25 | 1.6 | 1.4 | 1.25 | 1.25 | 1.3 | 1.25 | 1.4 | 1.25 | 1.4 | 1.3 |

EXAMPLE 7

Compound (24), (25), (26) or (28) was used as a chain halogenated silicon compound represented by the above-mentioned general formula to form an a-Si deposition film by the apparatus of FIG. 1.

A conductive film substrate ("#7059" available from Corning Glass Works) was placed on the support 2, and the deposition chamber 1 was evacuated by an exhausting apparatus to a pressure of $10^{-6}$ Torr. The halogenated silicon compound gas and hydrogen gas were supplied to the deposition chamber 1 at flow rates of 110 SCCM and 40 SCCM, respectively, while the substrate was kept at each of the temperatures shown in Table 7. Light from a low-pressure mercury lamp was radiated

TABLE 5

| Si compound | Si$_2$H$_6$ | 1 | 6 | 10 | 11 | 14 | 24 | 26 | 27 | 30 | 32 | 36 | 38 | 41 |
|---|---|---|---|---|---|---|---|---|---|---|---|---|---|---|
| Substrate temperature (°C.) | 250 | 90 | 85 | 75 | 90 | 75 | 90 | 80 | 75 | 80 | 80 | 75 | 75 | 75 |
| Rectification ratio*[1] of diode | 7.0 | 7.9 | 8.5 | 7.1 | 8.9 | 8.8 | 9.1 | 7.9 | 8.9 | 8.0 | 8.9 | 8.0 | 9.0 | 7.9 |
| η value*[2] of diode | 1.6 | 1.4 | 1.25 | 1.6 | 1.25 | 1.3 | 1.25 | 1.4 | 1.25 | 1.3 | 1.25 | 1.4 | 1.25 | 1.5 |

*[1] Ratio of forward-bias current to reverse-bias current at 1V
*[2] η value in p-n junction current expression $$J = J_s \left\{ \exp\left(\frac{eV}{\eta kT}\right) - 1 \right\}$$

vertically onto the substrate at a light intensity of 100 mW/cm² while the deposition chamber 1 was kept at a pressure of 0.1 Torr, thereby forming an i-type a-Si film having a thickness of 4,000 Å. A deposition rate was 35 Å/sec.

For the purpose of comparison, an a-Si film was formed using $Si_2H_6$ gas. In this case, a deposition rate was 15 Å/sec.

Each resultant film sample was placed in the deposition chamber which then evacuated to a pressure of $10^{-6}$ Torr. Aluminum was deposited on each sample at a vacuum pressure of $10^{-5}$ Torr and a deposition rate of 20 Å/sec to a thickness of 1,500 Å, thereby forming a comb-shaped Al gap electrode (having a length of 250μ and a width of 5 mm). A photocurrent (AM1, 100 mW/cm²) and a dark current were measured for each sample while a voltage of 10 V was being applied thereto. A photoconductivity σp and a ratio σp/σd of the photoconductivity to the dark conductivity were calculated to evaluate the resultant a-Si films. The obtained results are shown in Table 7.

TABLE 7

| Si compound | $Si_2H_6$ | (24) | (25) | (26) | (28) |
|---|---|---|---|---|---|
| Substrate temperature (°C.) | 250 | 120 | 90 | 80 | 110 |
| σp/σd | $10^{-5}/10^{-8} = 10^3$ | $9 \times 10^4$ | $7 \times 10^4$ | $6.5 \times 10^4$ | $6 \times 10^4$ |
| σp(Ω · cm)$^{-1}$ | $10^{-5}$ | $10^{-4}$ | $8 \times 10^{-5}$ | $2 \times 10^{-5}$ | $2 \times 10^{-5}$ |

As is apparent from Table 7, the a-Si films of the present invention have a high photoconductivity σp and a high ratio σp/σd as compared with the conventional film.

EXAMPLE 8

An a-Si film was formed following the same procedures as in Example 7 except that a polyimide substrate was used, that a high-pressure mercury lamp was used as a light source at an intensity of 200 mW/CM², and that compound (29), (30) or (32) was used as the chain silicon compound. The photoconductivities σp and the ratios σp/σd of the resultant films were measured. The obtained results are shown in Table 8.

TABLE 8

| Si compound | $Si_2H_6$ | (29) | (30) | (32) |
|---|---|---|---|---|
| Substrate temperature (°C.) | 250 | 110 | 90 | 90 |
| σp/σd | $10^{-5}/10^{-8} = 10^3$ | $8 \times 10^4$ | $5 \times 10^4$ | $2 \times 10^4$ |
| σp(Ω · cm)$^{-1}$ | $10^{-5}$ | $7 \times 10^{-5}$ | $3 \times 10^{-5}$ | $2 \times 10^{-5}$ |

EXAMPLE 9

Compound (24), (25), (26) or (28) was used as the chain halogenated silicon compound represented by the above-mentioned general formula, and $PH_3$ or $B_2H_6$ was used as an impurity compound. An a-Si deposition film doped with P (i.e., an n-type impurity) or B (i.e., a p-type impurity) was formed by the apparatus shown in FIG. 1.

A conductive film substrate ("#7059" available from Corning Inc.) was placed on the support 2, and the deposition chamber 1 was evacuated by a vacuum pump to a vacuum of $10^{-6}$ Torr. The substrate was kept at each of the temperatures given in Table 9, and a gas mixture of each halogenated silicon compound gas and $PH_3$ or $B_2H_6$ gas at a ratio of $1:5 \times 10^{-3}$ was supplied to the chamber at a flow rate of 110 SCCM. At the same time, $H_2$ gas was supplied to the chamber at a flow rate of 40 SCCM. Light from a high-pressure mercury lamp was radiated vertically onto the substrate at a light intensity of 200 mW/cm² while the chamber was kept at a vacuum of 0.1 Torr, thereby forming an impurity-doped a-Si film. A deposition rate was 35 Å/sec.

For the purpose of comparison, an a-Si film was formed using the $Si_2H_6$ gas. In this case, a deposition rate was 15 Å/sec.

Each resultant a-Si film sample was placed in the deposition chamber. Thereafter, aluminum was deposited on each sample at a vacuum pressure of $10^{-5}$ Torr to form a comb-shaped Al gap electrode (having a length of 250μ and a width of 5 mm). A dark current was measured for each sample while a voltage of 10 V was being applied thereto. A dark conductivity ρd of each sample was calculated to evaluate the resultant a-Si films. The obtained results are shown in Table 9.

TABLE 9

| Si compound | $Si_2H_6$ | (24) | (25) | (26) | (28) |
|---|---|---|---|---|---|
| Substrate temperature (°C.) | 250 | 120 | 100 | 80 | 110 |
| σd[n-type, (Ω · cm)$^{-1}$] | $8 \times 10^{-3}$ | $7 \times 10^{-1}$ | $5 \times 10^{-1}$ | $2 \times 10^{-1}$ | $8 \times 10^{-2}$ |
| σd[p-type, (Ω · cm)$^{-1}$] | $10^{-3}$ | $5 \times 10^{-2}$ | $3 \times 10^{-2}$ | $3 \times 10^{-2}$ | $8 \times 10^{-3}$ |

As is apparent from Table 9, the a-Si films of the present invention have sufficient doping efficiency and a high dark conductivity σd even at a low substrate temperature as compared with the conventional film prepared by using $Si_2H_6$ gas.

EXAMPLE 10

An a-Si deposition film was formed following the same procedures as in Example 9 except that a polyimide substrate and compound (29), (30) or (32) was used. The dark conductivities σd of the resultant films were measured. The obtained results are shown in Table 10.

TABLE 10

| Si compound | $Si_2H_6$ | (29) | (30) | (32) |
|---|---|---|---|---|
| Substrate temperature (°C.) | 250 | 110 | 90 | 90 |
| σd[n-type, (Ω · cm)$^{-1}$] | $8 \times 10^{-3}$ | $3 \times 10^{-1}$ | $9 \times 10^{-2}$ | $6 \times 10^{-2}$ |
| σd[p-type, (Ω · cm)$^{-1}$] | $10^{-3}$ | $10^{-2}$ | $7 \times 10^{-3}$ | $5 \times 10^{-3}$ |

EXAMPLE 11

Compound (24), (25), (26), or (28) was used as the chain halogenated silicon compound of the above-mentioned general formula to prepare a p-i-n diode of FIG. 2 using the apparatus of FIG. 1.

A glass substrate 21 deposited with an ITO film 22 having a thickness of 1,000 Å was placed on the support, and a p-type a-Si film 24 (film thickness of 400 Å)

doped with B was formed following the same procedures as in Example 9. A low-pressure mercury lamp was used as a light source, and its light intensity was 100 mW/cm².

An i-type a-Si film 25 (film thickness of 5,000 Å) was formed following the same procedures as in the p-type a-Si film except that $B_2H_6$ gas flow was stopped and the deposition chamber was kept at a pressure of 0.5 Torr.

Subsequently, a P-doped n-type a-Si film 26 (film thickness of 400 Å) was formed following the same procedures as in Example 9. In this case, the light radiation conditions were the same as those of the p-type a-Si film of this Example. An Al electrode 27 was formed by vacuum deposition on the n-type a-Si film to a thickness of 1,000 Å, thereby preparing a p-i-n diode.

For the purpose of comparison, a p-i-n diode was formed in the same manner as described above by using $Si_2H_6$.

The I–V characteristics of each resultant diode element (area of 1 cm²) were measured to evaluate the rectification characteristics and the photovoltaic effect. The obtained results are shown in Table 11.

TABLE 11

| Si compound | $Si_2H_6$ | (24) | (25) | (26) | (28) |
|---|---|---|---|---|---|
| Substrate temperature (°C.) | 250 | 120 | 100 | 80 | 110 |
| Rectification ratio*¹ of diode | 10⁷ | 10⁹ | 7 × 10⁷ | 5 × 10⁸ | 5 × 10⁸ |
| η value*² of diode | 1.6 | 1.25 | 1.35 | 1.4 | 1.35 |

*¹Ratio of forward-bias current to reverse-bias current at 1V
*²η value in p-n junction current expression $$J = J_s \left\{ \exp\left( \frac{eV}{\eta kT} \right) - 1 \right\}$$

As compared with the conventional case using $Si_2H_6$, good rectification characteristics were obtained even at a low substrate temperature according to Example 11, as is apparent from Table 11.

In addition, good light radiation characteristics could be obtained. For example, conversion efficiency was 8% or more by radiation at a light intensity of AM1 (about 100 mW/cm²) from the substrate, a free terminal voltage was 0.9 V, and a short-circuit current was 10 mA/cm².

EXAMPLE 12

A p-i-n diode was manufactured following the same procedures as in Example 11 except that a transparent conductive film (polyester-based) was used, that compound (29), (30) or (32) was used as the chain halogenated silicon compound of the above-mentioned general formula, and that a high-pressure mercury lamp was used at a light intensity of 200 mW/cm². Rectification ratios and rectification efficiency η of the resultant diodes were calculated. The obtained results are shown in Table 12.

TABLE 12

| Si compound | $Si_2H_6$ | (29) | (30) | (32) |
|---|---|---|---|---|
| Substrate temperature (°C.) | 250 | 110 | 90 | 80 |
| Rectification ratio*¹ of diode | 2 × 10⁷ | 9 × 10⁸ | 5 × 10⁸ | 10⁸ |
| η value*² of diode | 1.6 | 1.35 | 1.35 | 1.5 |

EXAMPLE 13

An a-Si deposition film was formed by the apparatus of FIG. 1 using compound (37), (38) or (39) as the cyclic silicon compound of the above-mentioned general formula.

A conductive film substrate ("#7059" available from Corning Glass Works) was placed on the support 2, and the deposition chamber 1 was evacuated by a vacuum pump. The deposition chamber 1 was kept at a reduced pressure of $10^{-6}$ Torr. The substrate was kept at each of the temperatures given in Table 13, and the halogenated silicon compound gas and hydrogen gas were supplied to the deposition chamber at flow rates of 110 SCCM and 40 SCCM, respectively. A low-pressure mercury lamp was turned on to radiate light onto the substrate at an intensity of 100 mW/cm² while the deposition chamber was kept at a pressure of 0.1 Torr, thereby forming an i-type a-Si film having a thickness of 4,000 Å. A deposition rate was 35 Å/sec.

For the purpose of comparison, an a-Si film was formed using the $Si_2H_6$ gas. In this case, a deposition rate was 15 Å/sec.

Each resultant a-Si film sample was placed in the deposition chamber which was evacuated to a vacuum pressure of $10^{-6}$ Torr. Thereafter, aluminum was deposited on each sample at a vacuum pressure of $10^{-5}$ Torr and a deposition rate of 20 Å/sec to a thickness of 1,500 Å, thereby forming a comb-shaped Al gap electrode (having a length of 250μ and a width of 5 mm). A photocurrent (AM1, 100 mW/cm²) and a dark current were measured at each sample while a voltage of 10 V was being applied thereto. A photoconductivity σp and a ratio σp/σd of the photoconductivity to the dark conductivity were calculated to evaluate the resultant a-Si films. The obtained results are shown in Table 13.

TABLE 13

| Si compound | $Si_2H_6$ | (37) | (38) | (39) |
|---|---|---|---|---|
| Substrate temperature (°C.) | 250 | 110 | 90 | 80 |
| σp/σd | $10^{-5}/10^{-8} = 10^3$ | 5 × 10⁴ | 3 × 10⁴ | 8 × 10⁴ |
| σp(Ω · cm)⁻¹ | 10⁻⁵ | 2 × 10⁻⁴ | 8 × 10⁻⁵ | 6 × 10⁻⁵ |

As is apparent from Table 13, the a-Si films of the present invention have an improved photoconductivity σp and a high ratio σp/σd evan at a low substrate temperature as compared with the conventional film.

EXAMPLE 14

An a-Si film was formed following the same procedures as in Example 13 except that a polyimide substrate was used, that a high-pressure mercury lamp was used at a light intensity of 200 mW/cm², and that compound (41), (42) or (45) was used. Photoconductivities σp and the ratios σp/σd of the resultant films were measured. The obtained results are shown in Table 14.

TABLE 14

| Si compound | $Si_2H_6$ | (41) | (42) | (45) |
|---|---|---|---|---|
| Substrate temperature (°C.) | 250 | 110 | 90 | 90 |
| σp/σd | $10^{-5}/10^{-8} = 10^3$ | 3 × 10⁴ | 8 × 10⁴ | 5 × 10⁴ |

TABLE 14-continued

| Si compound | Si$_2$H$_6$ | (41) | (42) | (45) |
|---|---|---|---|---|
| $\sigma p(\Omega \cdot cm)^{-1}$ | $10^{-5}$ | $10^{-4}$ | $8 \times 10^{-5}$ | $5 \times 10^{-5}$ |

EXAMPLE 15

Compound (37), (38) or (39) was used as the cyclic halogenated silicon compound of the above-mentioned general formula, and PH$_3$ or B$_2$H$_6$ was used as an impurity compound. An a-Si deposition film doped with P (i.e., an n-type impurity) or B (i.e., a p-type impurity) was formed by the apparatus shown in FIG. 1.

A conductive film substrate ("#7059" available from Corning Inc.) was placed on the support 2, and the deposition chamber 1 was evacuated by an exhausting apparatus to a vacuum of $10^{-6}$ Torr. The substrate was kept at each of the temperatures given in Table 15, and a gas mixture of each halogenated silicon compound gas and PH$_3$ or B$_2$H$_6$ gas at a ratio of $1:5 \times 10^{-3}$ was supplied to the chamber at a flow rate of 110 SCCM. At the same time, H$_2$ gas was supplied to the chamber at a flow rate of 40 SCCM. Light from a high-pressure mercury lamp was radiated vertically onto the substrate at a light intensity of 200 mW/cm$^2$ while the chamber was kept at a vacuum of 0.1 Torr, thereby forming an impurity-doped a-Si film. A deposition rate was 35 Å/sec.

For the purpose of comparison, an a-Si film was also formed using the Si$_2$H$_6$ gas. In this case, a deposition rate was 15 Å/sec.

Each resultant a-Si film sample was placed in the deposition chamber. Thereafter, aluminum was deposited on each sample at a vacuum pressure of $10^{-5}$ Torr to form a comb-shaped Al gap electrode (having a length of 250μ and a width of 5 mm). A dark current was measured at each sample while a voltage of 10 V was being applied thereto. A dark conductivity $\sigma d$ of each sample was calculated to evaluate the resultant a-Si films. The obtained results are shown in Table 15.

TABLE 15

| Si compound | Si$_2$H$_6$ | (37) | (38) | (39) |
|---|---|---|---|---|
| Substrate temperature (°C.) | 250 | 100 | 80 | 70 |
| $\sigma d$[n-type, $(\Omega \cdot cm)^{-1}$] | $8 \times 10^{-3}$ | $6 \times 10^{-1}$ | $4 \times 10^{-1}$ | $10^{-1}$ |
| $\sigma d$[p-type, $(\Omega \cdot cm)^{-1}$] | $10^{-3}$ | $4 \times 10^{-2}$ | $10^{-2}$ | $10^{-2}$ |

As is apparent from Table 15, the a-Si films of the present invention have sufficient doping efficiency and a high dark conductivity $\sigma d$ even at a low substrate temperature as compared with the conventional film prepared by using Si$_2$H$_6$ gas.

EXAMPLE 16

An a-Si deposition film was formed following the same procedures as in Example 15 except that a polyimide substrate and compound (41), (42) or (45) were used as the cyclic halogenated silicon compound of the above-mentioned general formula. The dark conductivities $\sigma d$ of the resultant films were measured. The obtained results are shown in Table 16.

TABLE 16

| Si compound | Si$_2$H$_6$ | (41) | (42) | (45) |
|---|---|---|---|---|
| Substrate temperature (°C.) | 250 | 110 | 90 | 80 |
| $\sigma d$[n-type, $(\Omega \cdot cm)^{-1}$] | $8 \times 10^{-3}$ | $3 \times 10^{-1}$ | $7 \times 10^{-2}$ | $5 \times 10^{-2}$ |
| $\sigma d$[p-type, $(\Omega \cdot cm)^{-1}$] | $10^{-3}$ | $8 \times 10^{-3}$ | $4 \times 10^{-3}$ | $4 \times 10^{-3}$ |

EXAMPLE 17

Compound (37), (38) or (39) was used as the cyclic halogenated silicon compound of the above-mentioned general formula to prepare a p-i-n diode of FIG. 2 by using the apparatus of FIG. 1.

A glass substrate 21 deposited with an ITO film 22 having a thickness of 1,000 Å was placed on the support, and the p-type a-Si film 24 (film thickness of 400 Å) doped with B was formed following the same procedures as in Example 15. A low-pressure mercury lamp was used as a light source, and its light intensity was 100 mW/cm$^2$.

An i-type a-Si film 25 (film thickness of 5,000 Å) was formed following the same procedures as in the p-type a-Si film except that B$_2$H$_6$ gas flow was stopped and the deposition chamber was kept at a pressure of 0.5 Torr.

Subsequently, a P-doped n-type a-Si film 26 (film thickness of 400 Å) was formed following the same procedures as in Example 15. In this case, the light radiation conditions were the same as those for producing the p-type a-Si film. An Al electrode 27 was formed by vacuum deposition on the n-type a-Si film to a thickness of 1,000 Å, thereby preparing a p-i-n diode.

For the purpose of comparison, a p-i-n didode was formed in the same manner as described above by using Si$_2$H$_6$.

The I–V characteristics of each resultant diode element (area of 1 cm$^2$) were measured to evaluate the rectification characteristics and the photovoltaic effect. The obtained results are shown in Table 17.

TABLE 17

| Si compound | Si$_2$H$_6$ | (37) | (38) | (39) |
|---|---|---|---|---|
| Substrate temperature (°C.) | 250 | 100 | 80 | 70 |
| Rectification ratio*[1] of diode | $10^7$ | $2 \times 10^8$ | $10^8$ | $10^8$ |
| $\eta$ value*[2] of diode | 1.6 | 1.4 | 1.4 | 1.5 |

*[1] ratio of forward-bias current to reverse-bias current at 1V
*[2] $\eta$ value in p-n junction current $$\text{expression } J = J_s \left\{ \exp\left(\frac{eV}{\eta kT}\right) - 1 \right\}$$

As compared with the conventional case using Si$_2$H$_6$, good rectification characteristics were obtained even at a low substrate temperature according to the present invention, as is apparent from Table 17.

In addition, good light radiation characteristics could be obtained. For example, conversion efficiency was 8% or more by radiation at a light intensity of AM1 (about 100 mW/cm$^2$) from the substrate side, a free terminal voltage was 0.9 V, and a short-circuit current was 10 mA/cm$^2$.

EXAMPLE 18

A p-i-n diode was manufactured following the same procedures as in Example 17 except that a transparent conductive film (polyester-based) was used, that compound (41), (42) or (45) was used as the cyclic halogenated silicon compound of the above-mentioned general formula, and that a high-pressure mercury lamp was used at a light intensity of 200 mW/cm$^2$. Rectification ratios and rectification efficiency $\eta$ of the resultant diodes were calculated. The obtained results are shown in Table 18.

TABLE 18

| Si compound | Si$_2$H$_6$ | (41) | (42) | (45) |
|---|---|---|---|---|
| Substrate temperature (°C.) | 250 | 110 | 90 | 80 |
| Rectification ratio*$^1$ of diode | $2 \times 10^7$ | $10^8$ | $8 \times 10^7$ | $5 \times 10^7$ |
| $\eta$ value*$^2$ of diode | 1.6 | 1.4 | 1.5 | 1.5 |

EXAMPLE 19

An a-Si deposition film was formed by the apparatus of FIG. 1 using compound (47) (48) or (52) as the cyclic halogenated silicon compound of the above-mentioned general formula.

A conductive film substrate ("#7059" available from Corning Inc.) was placed on the support 2, and the deposition chamber 1 was evacuated by a vacuum pump. The deposition chamber 1 was kept at a reduced pressure of 10$^{-6}$ Torr. The substrate 21 was kept at each of the temperatures given in Table 19, and the halogenated silicon compound gas and hydrogen gas were supplied to the deposition chamber at flow rates of 110 SCCM and 40 SCCM, respectively. A low-pressure mercury lamp was radiated vertically onto the substrate at a light intensity of 100 mW/cm$^2$ while the deposition chamber was kept at a pressure of 0.1 Torr, thereby forming an i-type a-Si film having a thickness of 4,000 Å. A deposition rate was 35 Å/sec.

For the purpose of comparison, an a-Si film was also formed using the Si$_2$H$_6$ gas. In this case, a deposition rate was 15 Å/sec.

Each resultant a-Si film sample was placed in the deposition chamber which was evacuated to a vacuum pressure of 10$^{-6}$ Torr. Thereafter, aluminum was deposited on each sample at a vacuum pressure of 10$^{-5}$ Torr and a deposition rate of 20 Å/sec to a thickness of 1,500 Å, thereby forming a comb-shaped Al gap electrode (having a length of 250$\mu$ and a width of 5 mm). A photocurrent (AM1, 100 mW/cm$^2$) and a dark current were measured at each sample while a voltage of 10 V was being applied thereto. A photoconductivity $\sigma$p and a ratio $\sigma$p/$\sigma$d of the photoconductivity to the dark conductivity were calculated to evaluate the resultant a-si films. The obtained results are shown in Table 19.

TABLE 19

| Si compound | Si$_2$H$_6$ | (47) | (48) | (52) |
|---|---|---|---|---|
| Substrate temperature (°C.) | 250 | 100 | 95 | 80 |
| $\sigma$p/$\sigma$d | $10^{-5}/10^{-8} = 10^3$ | $2 \times 10^4$ | $10^4$ | $8 \times 10^4$ |
| $\sigma$p($\Omega \cdot$cm)$^{-1}$ | $10^{-5}$ | $10^{-4}$ | $8 \times 10^{-5}$ | $7 \times 10^{-5}$ |

As is apparent from Table 19, the a-Si films of the present invention have an improved photoconductivity $\sigma$p and a high ratio $\sigma$p/$\sigma$d even at a low substrate temperature as compared with the conventional film.

EXAMPLE 20

An a-Si film was formed following the same procedures as in Example 19 except that a polyimide substrate was used, that a high-pressure mercury lamp was used at a light intensity of 200 mW/cm$^2$, and that compound (59), (60) or (71) was used as the cyclic halogenated silicon compound of the above-mentioned general formula. Photoconductivities $\sigma$p and the ratios $\sigma$p/$\sigma$d of the resultant films were measured. The obtained results are shown in Table 20.

TABLE 20

| Si compound | Si$_2$H$_6$ | (59) | (60) | (71) |
|---|---|---|---|---|
| Substrate temperature (°C.) | 250 | 100 | 90 | 60 |
| $\sigma$p/$\sigma$d | $10^{-5}/10^{-8} = 10^3$ | $2 \times 10^4$ | $8 \times 10^3$ | $4 \times 10^3$ |
| $\sigma$p($\Omega \cdot$cm)$^{-1}$ | $10^{-5}$ | $8 \times 10^{-5}$ | $3 \times 10^{-5}$ | $3 \times 10^{-5}$ |

EXAMPLE 21

Compound (47), (48) or (52) was used as the cyclic halogenated silicon compound of the above-mentioned general formula, and PH$_3$ or B$_2$H$_6$ was used as an impurity compound. An a-Si deposition film doped with P (i.e., an n-type impurity) or B (i.e., a p-type impurity) was formed by the apparatus shown in FIG. 1.

A conductive film substrate ("#7059" available from Corning Inc.) was placed on the support 2, and the deposition chamber 1 was evacuated by an exhausting apparatus to a vacuum of 10$^{-6}$ Torr. The substrate was kept at each of the temperatures given by Table 21, and a gas mixture of each halogenated silicon compound gas and PH$_3$ or B$_2$H$_6$ gas at a ratio of 1:5×10$^{-3}$ was supplied to the chamber at a flow rate of 110 SCCM. At the same time, H$_2$ gas was supplied to the chamber at a flow rate of 40 SCCM. Light from a high-pressure mercury lamp was radiated vertically onto the substrate at a light intensity of 200 mW/cm$^2$ while the chamber was kept at a vacuum of 0.1 Torr, thereby forming an impurity-doped a-Si film. A deposition rate was 35 Å/sec.

As a comparative example, an a-Si film was formed using the Si$_2$H$_6$ gas. In this case, a deposition rate was 15 Å/sec.

Each resultant a-Si film sample was placed in the deposition chamber. Thereafter, aluminum was deposited on each sample at a vacuum pressure of 10$^{-5}$ Torr to form a comb-shaped Al gap electrode (having a length of 250$\mu$ and a width of 5 mm). A dark current was measured at each sample while a voltage of 10 V was being applied thereto. A dark conductivity $\sigma$d of each sample was calculated to evaluate the resultant a-Si films. The obtained results are shown in Table 21.

TABLE 21

| Si compound | Si$_2$H$_6$ | (47) | (48) | (52) |
|---|---|---|---|---|
| Substrate temperature (°C.) | 250 | 100 | 95 | 80 |
| σd[n-type, (Ω·cm)$^{-1}$] | 8 × 10$^{-3}$ | 2 × 10$^{-1}$ | 5 × 10$^{-2}$ | 2 × 10$^{-2}$ |
| σd[p-type, (Ω·cm)$^{-1}$] | 10$^{-3}$ | 10$^{-2}$ | 7 × 10$^{-3}$ | 5 × 10$^{-3}$ |

As is apparent from Table 21, the a-Si films of the present invention have sufficient doping efficiency and a high dark conductivity σd even at a low substrate temperature as compared with the conventional film prepared by using Si$_2$H$_6$ gas.

EXAMPLE 22

An a-Si deposition film was formed following the same procedures as in Example 21 except that a polyimide substrate and compound (59), (60) or (71) were used as the cyclic halogenated silicon compound of the above-mentioned general formula. The dark conductivities σd of the resultant films were measured. The obtained results are shown in Table 22.

TABLE 22

| Si compound | Si$_2$H$_6$ | (59) | (60) | (71) |
|---|---|---|---|---|
| Substrate temperature (°C.) | 250 | 100 | 90 | 60 |
| σd[n-type, (Ω·cm)$^{-1}$] | 8 × 10$^{-3}$ | 10$^{-1}$ | 4 × 10$^{-2}$ | 8 × 10$^{-3}$ |
| σd[p-type, (Ω·cm)$^{-1}$] | 10$^{-3}$ | 6 × 10$^{-3}$ | 5 × 10$^{-3}$ | 3 × 10$^{-3}$ |

EXAMPLE 23

Compound (47), (48) or (52) was used as the cyclic halogenated silicon compound as above-mentioned general formula to prepare a p-i-n diode of FIG. 2 using the apparatus of FIG. 1.

A glass substrate 21 deposited with an ITO film 22 having a thickness of 1,000 Å was placed on the support, and a p-type a-Si film 24 (film thickness of 400 Å) doped with B was formed following the same procedures as in Example 21. A low-pressure mercury lamp was used as a light source, and its light intensity was 100 mW/cm$^2$.

An i-type a-Si film 25 (film thickness of 5,000 Å) was formed following the same procedures as in the p-type a-Si film except that B$_2$H$_6$ gas flow was stopped and the deposition chamber was kept at a pressure of 0.5 Torr.

Subsequently, a P-doped n-type a-Si film 26 (film thickness of 400 Å) was formed following the same procedures as in Example 21. In this case, the light radiation conditions were the same as those for producing the p-type a-Si film. An Al electrode 27 was formed by vacuum deposition on the n-type a-Si film to a thickness of 1,000 Å, thereby preparing a p-i-n diode.

For the purpose of comparison, a p-i-n diode was formed in the same manner as described above using Si$_2$H$_6$.

The I-V characteristics of each resultant diode element (area of 1 cm$^2$) were measured to evaluate the rectification characteristics and the photovoltaic effect. The obtained results are shown in Table 23.

TABLE 23

| Si compound | Si$_2$H$_6$ | (47) | (48) | (52) |
|---|---|---|---|---|
| Substrate temperature (°C.) | 250 | 100 | 95 | 80 |
| Rectification ratio*[1] of diode | 10$^7$ | 7 × 10$^7$ | 8 × 10$^7$ | 2 × 10$^7$ |
| η value*[2] of diode | 1.6 | 1.4 | 1.5 | 1.5 |

*[1] ratio of forward-bias current to reverse-bias current at 1V
*[2] η value in p-n junction current expression $J = J_s \left\{ \exp\left(\frac{ev}{\eta kT}\right) - 1 \right\}$ As compared with the conventional case using Si$_2$H$_6$, good rectification characteristics were obtained even at a low substrate temperature according to the present invention, as is apparent from Table 23.

In addition, good light radiation characteristics could be obtained. For example, conversion efficiency was 8% or more by radiation at a light intensity of AM1 (about 100 mW/cm$^2$) from the substrate side, a free terminal voltage was 0.9 V, and a short-circuit current was 10 mA/cm$^2$.

EXAMPLE 24

A p-i-n diode was manufactured following the same procedures as in Example 23 except that a transparent conductive film (polyester-based) was used, that compound (59), (60) or (71) was used as the cyclic halogenated silicon compound of the above-mentioned general formula, and that a high-pressure mercury lamp was used at a light intensity of 200 mW/cm$^2$. Rectification ratios and rectification efficiency η of the resultant diodes were calculated. The obtained results are shown in Table 24.

TABLE 24

| Si compound | Si$_2$H$_6$ | (59) | (60) | (71) |
|---|---|---|---|---|
| Substrate temperature (°C.) | 250 | 100 | 90 | 60 |
| Rectification ratio*[1] of diode | 2 × 10$^7$ | 6 × 10$^7$ | 5 × 10$^7$ | 3 × 10$^7$ |
| η value*[2] of diode | 1.6 | 1.45 | 1.45 | 1.5 |

EXAMPLE 25

Compound (79), (80), (85) or (86) as a chain halogenated silicon compound of the above-mentioned general formula was used to form an a-Si deposition film by the apparatus of FIG. 1.

A conductive film substrate ("#7059" available from Corning Inc.) was placed on the support 2, and the deposition chamber 1 was evacuated by an exhausting apparatus to a pressure of 10$^{-6}$ Torr. The halogenated silicon compound gas and hydrogen gas were supplied to the deposition chamber 1 at flow rates of 110 SCCM and 40 SCCM, respectively, while the substrate was kept at each of the temperatures shown in Table 25. Light from a low-pressure mercury lamp was radiated vertically onto the substrate at a light intensity of 100 mW/cm$^2$ while the deposition chamber 1 was kept at a pressure of 0.1 Torr, thereby forming an i-type a-Si film having a thickness of 4,000 Å. A deposition rate was 35 Å/sec.

As a comparative example, an a-Si film was formed using Si$_2$H$_6$ gas. In this case, a deposition rate was 15 Å/sec.

Each resultant film sample was placed in the deposition chamber which was then evacuated to a pressure of $10^{-6}$ Torr. Aluminum was deposited on each sample at a vacuum pressure of $10^{-5}$ Torr and a deposition rate of 20 Å/sec to a thickness of 1,500 Å, thereby forming a comb-shaped Al gap electrode (having a length of 250μ and a width of 5 mm). A photocurrent (AM1, 100 mW/cm$^2$) and a dark current was measured at each sample while a voltage of 10 V was being applied thereto. A photoconductivity σp and a ratio σp/σd of the photoconductivity to the dark conductivity were calculated to evaluate the resultant a-Si films. The obtained results are shown in Table 25.

TABLE 25

| Si compound | Si$_2$H$_6$ | (79) | (80) | (85) | (86) |
|---|---|---|---|---|---|
| Substrate temperature (°C.) | 250 | 120 | 90 | 80 | 80 |
| σp/σd | $10^{-5}/10^{-8} = 10^3$ | $7 \times 10^4$ | $5 \times 10^4$ | $5 \times 10^4$ | $3 \times 10^4$ |
| σp(Ω · cm)$^{-1}$ | $10^{-5}$ | $9 \times 10^{-5}$ | $8 \times 10^{-5}$ | $5 \times 10^{-5}$ | $2 \times 10^{-5}$ |

As is apparent from Table 25, the a-Si films of the present invention have an improved photoconductivity σp and a high ratio σp/σd even at a low substrate temperature as compared with the conventional film.

EXAMPLE 26

An a-Si film was formed following the same procedures as in Example 25 except that a polyimide substrate was used, that a high-pressure mercury lamp was used as a light source at an intensity of 200 mW/cm$^2$, and that compound (90), (91) or (93) was used as the chain halogenated silicon compound of the above-mentioned general formula. The photoconductivities σd and the ratios σp/σd of the resultant films were measured. The obtained results are shown in Table 26.

TABLE 26

| Si compound | Si$_2$H$_6$ | (90) | (91) | (93) |
|---|---|---|---|---|
| Substrate temperature (°C.) | 250 | 100 | 90 | 90 |
| σp/σd | $10^{-5}/10^{-8} = 10^3$ | $6 \times 10^4$ | $5 \times 10^4$ | $3 \times 10^4$ |
| σp(Ω · cm)$^{-1}$ | $10^{-5}$ | $5 \times 10^{-5}$ | $2 \times 10^{-5}$ | $2 \times 10^{-5}$ |

EXAMPLE 27

Compound (79), (80), (85) or (86) was used as the chain halogenated silicon compound of the above-mentioned general formula, and PH$_3$ or B$_2$H$_6$ was used as an impurity compound. An a-Si deposition film doped with P (i.e., an n-type impurity) or B (i.e., a p-type impurity) was formed by the apparatus shown in FIG. 1.

A conductive film substrate ("#7059" available from Corning Inc.) was placed on the support 2, and the deposition chamber 1 was evacuated by an exhausting apparatus to a vacuum of $10^{-6}$ Torr. The substrate was kept at each of the apparatus given by Table 27, and a gas mixture of each halogenated silicon compound gas and PH$_3$ or B$_2$H$_6$ gas at a ratio of $1:5 \times 10^{-3}$ was supplied to the chamber at a flow rate of 110 SCCM. At the same time, H$_2$ gas was supplied to the chamber at a flow rate of 40 SCCM. Light from a high-pressure mercury lamp was radiated vertically onto the substrate at a light intensity of 200 mW/cm$^2$ while the chamber was kept at a vacuum of 0.1 Torr, thereby forming an impurity-doped a-Si film. A deposition rate was 35 Å/sec.

For the purpose of comparison, an a-Si film was formed using the Si$_2$H$_6$ gas. In this case, a deposition rate was 15 Å/sec.

Each resultant a-Si film sample was placed in the deposition chamber. Thereafter, aluminum was deposited on each sample at a vacuum pressure of $10^{-5}$ Torr to form a comb-shaped Al gap electrode (having a length of 250μ and a width of 5 mm). A dark current was measured at each sample while a voltage of 10 V was being applied thereto. A dark conductivity Σd of each sample was calculated to evaluate the resultant a-Si films. The obtained results are shown in Table 27.

TABLE 27

| Si compound | Si$_2$H$_6$ | (79) | (80) | (85) | (86) |
|---|---|---|---|---|---|
| Substrate temperature (°C.) | 250 | 120 | 90 | 80 | 80 |
| σd[n-type, (Ω · cm)$^{-1}$] | $8 \times 10^{-3}$ | $6 \times 10^{-1}$ | $4 \times 10^{-1}$ | $7 \times 10^{-2}$ | $5 \times 10^{-2}$ |
| σd[p-type, (Ω · cm)$^{-1}$] | $10^{-3}$ | $4 \times 10^{-2}$ | $2 \times 10^{-2}$ | $2 \times 10^{-2}$ | $7 \times 10^{-3}$ |

As is apparent from Table 27, the a-Si films of the present invention have sufficient doping efficiency and a high dark conductivity σd even at a low substrate temperature as compared with the conventional film prepared by using Si$_2$H$_6$ gas.

EXAMPLE 28

An a-Si deposition film was formed following the same procedures as in Example 27 except that a polyimide substrate and compound (90), (91) or (93) were used as the chain halogenated silicon compound of the above-mentioned general formula. The dark conductivities σd of the resultant films were measured. The obtained results are shown in Table 28.

TABLE 28

| Si compound | Si$_2$H$_6$ | (90) | (91) | (93) |
|---|---|---|---|---|
| Substrate temperature (°C.) | 250 | 100 | 90 | 90 |
| σd[n-type, (Ω · cm)$^{-1}$] | $8 \times 10^{-3}$ | $2 \times 10^{-1}$ | $7 \times 10^{-2}$ | $4 \times 10^{-2}$ |
| σd[p-type, (Ω · cm)$^{-1}$] | $10^{-3}$ | $10^{-2}$ | $5 \times 10^{-3}$ | $4 \times 10^{-3}$ |

EXAMPLE 29

Compound (79), (80), (85) or (86) was used as the chain halogenated silicon compound of the above-mentioned general formula (E) to prepare a p-i-n diode of FIG. 2 using the apparatus of FIG. 1.

A glass substrate 21 deposited with an ITO film 22 having a thickness of 1,000 Å was placed on the support, and a p-type a-Si film 24 (film thickness of 400 Å) doped with B was formed following the same procedures as in Example 27. A low-pressure mercury lamp was used as a light source, and its light intensity was 100 mW/cm$^2$.

An i-type a-Si film 25 (film thickness of 5,000 Å) was formed following the same procedures as in the p-type a-Si film except that B$_2$H$_6$ gas flow was stopped and the deposition chamber was kept at a pressure of 0.5 Torr.

Subsequently, a P-doped n-type a-Si film 26 (film thickness of 400 Å) was formed following the same procedures as in Example 27. In this case, the light radiation conditions were the same as those for producing the p-type a-Si film of Example 29. An Al electrode 27 was formed by vacuum deposition on the n-type a-Si film to a thickness of 1,000 Å, thereby preparing a p-i-n diode.

For the purpose of comparison, a p-i-n diode was formed in the same manner as described above using Si$_2$H$_6$.

The I–V characteristics of each resultant diode element (area of 1 cm$^2$) were measured to evaluate the rectification characteristics and the photovoltaic effect. The obtained results are shown in Table 29.

TABLE 29

| Si compound | Si$_2$H$_6$ | (79) | (80) | (85) | (86) |
|---|---|---|---|---|---|
| Substrate temperature (°C.) | 250 | 120 | 90 | 80 | 80 |
| Rectification ratio*$^1$ of diode | 10$^7$ | 10$^8$ | 4 × 10$^7$ | 3 × 10$^7$ | 3.5 × 10$^7$ |
| η value*$^2$ of diode | 1.6 | 1.35 | 1.4 | 1.5 | 1.5 |

*$^1$ratio of forward-bias current to reverse-bias current at 1V
*$^2$η value in p-n junction current expression $J = J_s \left\{ \exp\left(\dfrac{eV}{\eta kT}\right) - 1 \right\}$ As compared with the conventional case using Si$_2$H$_6$, good rectification characteristics were obtained even at a low substrate temperature according to the present invention, as is apparent from Table 29.

In addition, as to light radiation characteristics, light was introduced from the substrate side and conversion efficiency was 8% or more by radiation at a light intensity of AM1 (about 100 mW/cm$^2$) from the substrate side, a free terminal voltage was 0.9 V, and a short-circuit current was 10 mA/cm$^2$.

EXAMPLE 30

A p-i-n diode was manufactured following the same procedures as in Example 29 except that a transparent conductive film (polyester-based) was used, that compound (90), (91) or (93) was used as the chain halogenated silicon compound of the above-mentioned general formula, and that a high-pressure mercury lamp was used at a light intensity of 200 mW/cm$^2$. Rectification ratios and rectification efficiency η of the resultant diodes was calculated. The obtained results are shown in Table 30.

TABLE 30

| Si compound | Si$_2$H$_6$ | (90) | (91) | (93) |
|---|---|---|---|---|
| Substrate temperature (°C.) | 250 | 100 | 90 | 90 |
| Rectification ratio*$^1$ of diode | 2 × 10$^7$ | 5 × 10$^7$ | 4 × 10$^7$ | 4 × 10$^7$ |
| η value*$^2$ of diode | 1.6 | 1.4 | 1.5 | 1.5 |

EXAMPLE 31

An i-type a-Si (amorphous-Si) film was formed using the apparatus shown in FIG. 1 and silicon compound (101) described above as a starting material.

First, a substrate [Trade name: "Corning "7059"; transparent conductive film (polyester-based)] was placed on the support 2 inside the deposition chamber 1. The interior of the chamber 1 was evacuated to a pressure of 10$^{-6}$ Torr through the gas exhausting pipe 12 by an exhausting apparatus (not shown). The heater 4 was energized to keep the support at 90° C. The valves 6e and 6d of the gas supply source 6 filled with silicon compound (101) were opened to introduce the source gas into the chamber 1.

The gas flow rate was controlled at 150 SCCM while monitoring it by means of the corresponding flow meter 6b. Then, the pressure inside the deposition chamber was set at 0.1 Torr, and light of intensity 100 mW/cm$^2$ was generated from the light energy generator 14 and vertically irradiated the substrate. An i-type a-Si film having a thickness of 4,000 Å was deposited on the substrate 3 at a deposition rate of 50 Å/sec. The light energy uniformly irradiated the gas flowing near the substrate 3 arranged in the deposition chamber 1. At this time, the decomposition product other than a-Si and residual unreacted source gas were evacuated through the gas exhausting pipe 12. At the same time, fresh source gas was continuously supplied through the gas supply pipe 10.

The a-Si film formed in this manner by the method of the present invention was evaluated by the following method. Comb-shaped Al gap electrodes (gap length of 250μ and a width of 5 mm) were formed on respective a-Si films formed in the manner described above. Photocurrents (light intensity AMI: about 100 mW/cm$^2$) and dark currents were measured. Photoconductivity σp and ratios (σp/σd) of photoconductivity σp to dark conductivity σd were calculated.

Each gap electrode was formed by the following manner. After an a-Si film formed by the above method was placed in a deposition chamber, the chamber was reduced in pressure to a vacuum pressure of 10$^{-6}$ Torr and was then adjusted to a vacuum pressure of 10$^{-5}$ Torr. Al was deposited on the a-Si film to a thickness of 1,500 Å at a deposition rate of 20 Å/sec. The Al film thus formed was etched using a predetermined pattern mask.

The obtained σp value and the ratios σp/σd are shown in Table 31.

EXAMPLES 32–37 i-type a-Si films were formed each using silicon compounds (106), (114), (124), (126), (130) and (132) (Examples 32 to 37) in Table 31 as the starting materials for forming deposition films following the same procedures as in Example 31. The obtained I-type a-Si films were evaluated by the same method as in Example 31. The obtained evaluation results are shown in Table 31.

COMPARATIVE EXAMPLE 1

An i-type a-Si film was formed following the same procedures as in Example 5 except that Si$_2$H$_6$ was used as a starting material for forming a deposition film. The obtained a-Si film was evaluated by the same method as in Example 31. The obtained evaluation results are shown in Table 31.

EXAMPLES 38–44

A-Si films were formed each using silicon compounds (102), (110), (113), (114), (127), (130) and (134) (Examples 38 to 44) following the same procedures as in Example 31 except that the substrate temperature was set as shown in Table 32 and light of intensity 15 mJ/pulse from an Ar excimer laser vertically irradiated the substrates. The obtained a-Si films were evaluated by the same method as in Example 31. The obtained evaluation results are shown in Table 32.

COMPARATIVE EXAMPLE 2

An i-type a-Si film was formed following the same procedures as in Example 38 except that $Si_2H_6$ gas was used as a Si source gas. The obtained a-Si film was evaluated by the same method as in Example 35. The obtained evaluation results are shown in Table 32.

The obtained results of Examples 31 to 44 and Comparative Examples 1 and 2 are summarized as follows. As shown in Tables 31 and 32, when a low-pressure mercury lamp having a light intensity of 100 mW was used and the substrate temperature was set at 80° C., the deposition rate in Comparative Example 1 was 12 Å/sec, but the deposition rate in Examples 35, 36 and 37 of the present invention was 45 Å/sec. In addition, when an Ar excimer laser having an intensity of 15 mJ/pulse was used and the substrate temperature was 80° C., the deposition rate in Comparative Example 2 was 12 Å/sec, but the deposition rate in Examples 38, 40, 43 and 44 was 43 to 50 Å/sec. The photoconductivity of each of Examples 31 to 44 of the present invention was as high as $6 \times 10^{-5}$ to $1 \times 10^{-4}$, and the ratio $\sigma p/\sigma d$ was as high as $8 \times 10^3$ to $9 \times 10^4$.

and the valves 7e and 7d of the gas supply source 7 filled with diluted p-type impurity dopant gas $B_2H_6$ diluted to a dilution of 0.025 mole% by $H_2$ were opened, thereby introducing the gas mixture into the deposition chamber 1.

By monitoring the flow rates of the respective gases by the flow meters 6b and 7b, the mixing ratio of the gas of silicon compound (101) and $B_2H_6$ was set to be $B/Si = 5 \times 10^{-3}$ mol/mol and the flow rate of the gas mixture was set at 150 SCCM. The pressure inside the chamber was set at 0.1 Torr, and light of intensity 200 mW/cm$^2$ from a low-pressure mercury lamp in the optical energy generator 14 vertically irradiated the substrate. Thus, a p-type a-Si film (B concentration: $5 \times 10^{-3}$ atomic%) having a thickness of 400 Å was deposited on the substrate 3 at a film formation rate of 30 Å/sec. The light energy uniformly irradiated the gas flowing near the substrate 3 arranged inside the deposition chamber 1. The decomposition product other than a-Si and B and residual unreacted source gas were evacuated through the gas exhausting pipe 12. At the same time, fresh gas mixture was continuously supplied through the gas supply pipe 10.

The a-Si films obtained by the present invention were evaluated by the following method. Comb-shaped Al gap electrodes (a length of 250μ and a width of 5 mm) were formed on a-Si films formed on substrates, and

TABLE 31

| | Comparative Example 1 | Example 31 | Example 32 | Example 33 | Example 34 | Example 35 | Example 36 | Example 37 |
|---|---|---|---|---|---|---|---|---|
| Material compound | $Si_2H_6$ | 101 | 106 | 114 | 124 | 126 | 130 | 132 |
| Substrate temperature (°C.) | 80 | 90 | 85 | 75 | 90 | 80 | 80 | 80 |
| $\sigma p/\sigma d$*[1] | $1 \times 10^3$ | $1 \times 10^4$ | $5 \times 10^4$ | $7 \times 10^4$ | $9 \times 10^4$ | $2 \times 10^4$ | $6 \times 10^4$ | $5 \times 10^4$ |
| $\sigma p$*[2] | $1 \times 10^{-5}$ | $9 \times 10^{-5}$ | $8 \times 10^{-5}$ | $8 \times 10^{-5}$ | $5 \times 10^{-5}$ | $9 \times 10^{-5}$ | $9 \times 10^{-5}$ | $7 \times 10^{-5}$ |
| Deposition rate (Å/sec) | 12 | 50 | 50 | 47 | 45 | 45 | 45 | 45 |

*[1] $\sigma p/\sigma d$ (ratio of photoconductivity to dark conductivity)
*[2] $\sigma p$ [photoconductivity: $(\Omega \cdot cm)^{-1}$]

TABLE 32

| | Comparative Example 2 | Example 38 | Example 39 | Example 40 | Example 41 | Example 42 | Example 43 | Example 44 |
|---|---|---|---|---|---|---|---|---|
| Material compound | $Si_2H_6$ | 102 | 110 | 113 | 114 | 127 | 130 | 134 |
| Substrate temperature (°C.) | 80 | 80 | 75 | 80 | 75 | 75 | 80 | 80 |
| $\sigma p/\sigma d$*[1] | $1 \times 10^3$ | $3 \times 10^4$ | $8 \times 10^3$ | $3 \times 10^4$ | $9 \times 10^4$ | $9 \times 10^4$ | $4 \times 10^4$ | $8 \times 10^4$ |
| $\sigma p$*[2] | $1 \times 10^{-5}$ | $1 \times 10^{-4}$ | $6 \times 10^{-5}$ | $8 \times 10^{-5}$ | $8 \times 10^{-5}$ | $9 \times 10^{-5}$ | $6 \times 10^{-5}$ | $9 \times 10^{-5}$ |
| Deposition rate (Å/sec) | 12 | 50 | 45 | 45 | 45 | 45 | 43 | 40 |

*[1] $\sigma p/\sigma d$ (ratio of photoconductivity to dark conductivity)
*[2] $\sigma p$ (photoconductivity: $(\Omega \cdot cm)^{-1}$)

EXAMPLE 45

A p-type a-Si film doped with p-type impurity atoms was formed using the apparatus shown in FIG. 1, silicon compound (101) gas as an Si source gas and $B_2H_6$ gas as a p-type impurity dopant gas.

First, a substrate 3 ["Corning #7059"; transparent conductive film (polyester-based)] was placed on the support 2. The pressure of the interior of the deposition chamber 1 was reduced to $10^{-6}$ Torr through the gas exhausting pipe 12 by an exhausting apparatus (not shown). The heater 4 was energized to keep the substrate temperature at 90° C. The valves 6e and 6d of the gas supply source 6 filled with silicon compound (101)

dark currents were measured. Dark conductivity $\sigma d$ was determined.

The gap electrodes were formed in the following manner. After the a-Si films formed in the above manner were placed in the deposition chamber 1 and the deposition chamber was reduced once in pressure to $10^{-6}$ Torr, the vacuum pressure was adjusted to $10^{-5}$ Torr. Al was deposited on the respective a-Si films to a thickness of 1,500 Å at a deposition rate of 20 Å/sec. The Al films formed in this manner were etched using pattern masks of predetermined patterns, thereby obtaining the gap electrodes.

The dark conductivity σd obtained is shown in Table 33.

EXAMPLES 46–51

P-type a-Si films were formed following the same procedures as in Example 45 except that silicon compounds (106), (114), (124), (126), (130) and (132) (Examples 46 to 51) were individually used as Si source gas materials and that the substrate temperature was set as in Table 33. The dark conductivities σd of the obtained a-Si films were measured following the same procedures as in Example 45. The obtained results are shown in Table 33.

COMPARATIVE EXAMPLE 3

A p-type a-Si film was formed following the same procedures as in Example 49 except that $Si_2H_6$ gas was used as a-Si source gas. The dark conductivity σd of the obtained a-Si film was measured following the same procedures as in Example 45. The obtained result is shown in Table 33.

EXAMPLE 52

A-Si films (thickness of 4,000 Å) doped with phosphorus atoms as an n-type impurity were formed following the same procedures as in Example 45 except that a gas supply source 8 filled with an n-type impurity dopant gas $PH_3$ diluted with $H_2$ (to a dilution of 0.05 mol%) was used in place of the $B_2H_6$ gas supply source 6, and the flow rate of the $PH_3$ gas was adjusted such that the mixing rate of the $PH_3$ gas and the gas of silicon compound (102), P/Si, was $5 \times 10^{-3}$ mol/mol, and that the flow rate of the gas mixture was 150 SCCM. Comb-shaped Al gap electrodes were formed on the n-type a-Si films formed in this manner following the same procedures as in Example 45, and the dark conductivities σd of the obtained films were measured. The obtained results are shown in Table 34.

EXAMPLES 53–58

N-type a-Si films were formed following the same procedures as in Example 52 except that silicon compounds (106), (114), (124), (126), (130) and (132) (Examples 53 to 58) were individually used as Si source materials, and the substrate temperatures were set as in Table 34. The dark conductivity σd of each obtained a-Si film was measured following the same procedures as in Example 45. The obtained results are shown in Table 34.

COMPARATIVE EXAMPLE 4

An n-type film was formed following the same procedures as in Example 56 except that $Si_2H_6$ gas was used as an Si source gas. The dark conductivity σd of the obtained a-Si film was measured following the same procedures as in Example 45. The obtained results are shown in Table 34.

EXAMPLES 59–72

A total of 14 p- and n-type a-Si films (seven films each) were formed the same procedures as in Example 45 for producing the p-type a-Si films and following the same procedures as in Example 8 for producing the n-type a-Si films except that light from an ArF excimer laser having a wavelength of 193 nm and an intensity of 15 mJ/pulse was used in place of a low-pressure mercury lamp having a light intensity of 200 mW/cm². The dark conductivities σd of the obtained a-Si films were measured following the same procedures as in Example 45. The obtained results are shown in Tables 35 and 36.

COMPARATIVE EXAMPLES 5 AND 6

A p-type a-Si film (Comparative Example 3) and an n-type a-Si film (Comparative Example 4) were formed following the procedures of Examples 59 and 66, respectively, except that $Si_2H_6$ gas was used as an Si source gas. The dark conductivities σd of the obtained a-Si films were measured following the same procedures as in Example 45. The obtained results are shown in Tables 35 and 36.

The results obtained in Examples 45 to 72 and Comparative Examples 1 to 4 can be summarized as follows. As can be seen from the corresponding evaluation columns in Tables 34 to 37, when low-pressure mercury lamp light having an intensity of 200 mW/cm² was used and the substrate temperature was 80° C., the deposition rate in Comparative Examples 1 and 2 was 12 Å/sec while that in Examples 49, 50, 51, 56, 57 and 58 was 27 Å/sec. When an ArF excimer laser having an intensity of 15 mJ/pulse was used and the substrate temperature was 80° C., the deposition rate in Comparative Examples 3 and 4 was 12 Å/sec while that in Examples 59, 61, 64, 65, 66, 68, 71 and 72 of the present invention was as good as 25 Å/sec. In any of Examples 45 to 72 of the present invention, an a-Si film having a satisfactory doping efficiency and a high dark conductivity σd was obtained.

EXAMPLE 73

A p-i-n diode device as shown in FIG. 2 was manufactured in the manner to be described below using the apparatus shown in FIG. 1, silicon compound (101) as an Si source material, and light from a low-pressure mercury lamp having an intensity of 80 mW/cm² as excitation energy, and setting the substrate temperature at 90° C.

A substrate 21 with a thin electrode layer 22 (obtained by depositing an ITO layer of 1,000 Å on a glass substrate) was set on the support 2 inside the deposition chamber 1. Silicon compound (101) and $B_2H_6$ gas were introduced into the chamber 1 from the gas supply sources 6 and 7 so as to form a p-type a-Si film 24 under the same conditions as in Example 45.

When the thickness of the p-type a-Si film 24 being formed reached 400 Å, the valves 6e, 6d, 7e and 7d connected to the gas supply sources 6 and 7 were closed to stop any further supply of gases to the deposition chamber 1. After the gases in the deposition chamber 1 were evacuated by an exhausting apparatus (not shown), the valves 6e and 6d were opened and only the source gas consisting of silicon compound (101) for supplying Si was introduced into the chamber 1 at a flow rate of 150 SCCM.

In the same manner as in formation of the p-type a-Si film 24, light energy irradiation was performed to form an undoped or i-type a-Si film 25 (thickness of 5,000 Å) at the same deposition rate as that of the film 24.

The valves 8e and 8d coupled to the gas supply source 8 filled with the n-type impurity introducing gas $PH_3$ diluted to a dilution of 0.05 mol% with $H_2$ gas were opened to introduce $PH_3$ gas into the chamber 1. An n-type a-Si film 26 (thickness of 400 Å) doped with a p-type impurity was formed on the i-type a-Si film 25 following the same conditions in Example 50, thereby forming a semiconductor layer 23 consisting of the films 24, 25 and 26.

By vacuum deposition (at a pressure of $1\times10^{-5}$ Torr), an Al thin electrode layer 27 of 1,000 Å thickness was formed on the p-i-n a-Si semiconductor layer 23 formed according to the method of the present invention, thereby completing the p-i-n diode device.

For the p-i-n diode device (area 1 cm²) manufactured in this Example, evaluations were made as to the items of the rectification characteristics (ratio of forward current to reverse current at a voltage of 1 V) of the device, the n value (the n value at a current formula $J=J\{\exp(eV/nkT)-1\}$ of a p-n junction), and light irradiation characteristics (conversion efficiency at an irradiation intensity of about 100 mW/cm², a free terminal voltage, and short-circuit current). The obtained results are shown in Table 37.

EXAMPLES 74–85

Three-layered p-i-n a-Si semiconductor layers were formed following the same procedures as in Example 73 except that silicon compounds (106), (110), (111), (114), (124), (126), (127), (130), (132), (136), (138) and (141) (Examples 60 to 71) were respectively used as Si source gas materials and the substrate temperatures were respectively set as shown in Table 37. The p-i-n diode devices were prepared using these layers, respectively. The rectification characteristics, the n value, and the light irradiation characteristics of the obtained devices were evaluated following the same procedure as in Example 73. The obtained results are shown in Tables 37 and 38.

COMPARATIVE EXAMPLE 7

A three-layered p-i-n a-Si semiconductor layer was formed following the same procedures as in Example 73 except that $Si_2H_6$ was used as an Si source gas material. A p-i-n diode device was manufactured using the obtained p-i-n a-Si semiconductor layer. The rectification characteristics, the n value and the light irradiation characteristics of the obtained p-i-n diode device were examined following the same procedures as in Example 73. The obtained results are shown in Table 37.

EXAMPLES 86–97

Three-layered p-i-n a-Si semiconductor layers were formed following the same procedures as in Example 73 except that light from an ArF excimer laser having a wavelength of 193 nm and an intensity of 15 mJ/pulse was used in place of low-pressure mercury lamp light having an intensity of 80 mW/cm², the silicon compounds shown in Table 39 are used, and the substrate was set at each of the temperatures in Table 40. P-i-n diode devices were manufactured using these semiconductor layers. The rectification characteristics, the n value and the light irradiation characteristics of the obtained devices were examined following the same procedure as in Example 73. The obtained results are shown in Tables 39 and 40.

COMPARATIVE EXAMPLE 8

A three-layered p-i-n a-Si semiconductor layer was formed following the same procedure as in Example 86 except that $Si_2H_6$ gas was used as an Si source gas, and a p-i-n diode device was manufactured using this semiconductor layer. The rectification characteristics, the n value and the light irradiation characteristics of the obtained p-i-n diode device were evaluated following the same procedures as in Example 73. The obtained results are shown in Table 39.

The results of Examples 73 to 97 and Comparative Examples 7 and 8 are summarized as follows. The p-i-n diode devices obtained in Examples 73 to 97 had excellent rectification characteristics, i.e., rectification ratios given in a range of 7.1 to 9.1 when they expressed by common logarithm; conversion ratios of 8% or more; and excellent light irradiation characteristics, i.e., a free terminal voltage of 0.9 V and a short-circuit current of 13 mA/cm².

TABLE 33

| | Comparative Example 3 | Example 45 | 46 | 47 | 48 | 49 | 50 | 51 |
|---|---|---|---|---|---|---|---|---|
| Si compound | $Si_2H_6$ | 101 | 106 | 114 | 124 | 126 | 130 | 132 |
| Impurity atom doping compound | | | | $B_2H_6$ | | | | |
| Substrate temperature (°C.) | 80 | 90 | 85 | 75 | 90 | 80 | 80 | 80 |
| Dark conductivity $\sigma d\,(\Omega\cdot cm)^{-1}$ | $1\times10^{-3}$ | $8\times10^{-3}$ | $4\times10^{-2}$ | $3\times10^{-2}$ | $3\times10^{-2}$ | $2\times10^{-2}$ | $3\times10^{-2}$ | $3\times10^{-2}$ |
| Deposition rate (Å/sec) | 12 | 30 | 27 | 26 | 27 | 27 | 27 | 27 | characteristics of the obtained p-i-n diode device were

TABLE 34

| | Comparative Example 4 | Example 52 | 53 | 54 | 55 | 56 | 57 | 58 |
|---|---|---|---|---|---|---|---|---|
| Si compound | $Si_2H_6$ | 101 | 106 | 114 | 124 | 126 | 130 | 132 |
| Impurity atom doping compound | | | | $PH_3$ | | | | - |
| Substrate temperature (°C.) | 80 | 90 | 85 | 75 | 90 | 80 | 80 | 80 |
| Dark conductivity $\sigma d\,(\Omega\cdot cm)^{-1}$ | $8\times10^{-3}$ | $9\times10^{-2}$ | $2\times10^{-1}$ | $3\times10^{-1}$ | $2\times10^{-1}$ | $1\times10^{-1}$ | $4\times10^{-1}$ | $4\times10^{-1}$ |
| Deposition rate | 12 | 30 | 27 | 26 | 27 | 27 | 27 | 27 |

TABLE 34-continued

| | Comparative Example 4 | Example 52 | 53 | 54 | 55 | 56 | 57 | 58 |
|---|---|---|---|---|---|---|---|---|
| (Å/sec) | | | | | | | | |

TABLE 35

| | Comparative Example 5 | Example 59 | 60 | 61 | 62 | 63 | 64 | 65 |
|---|---|---|---|---|---|---|---|---|
| Si compound | $Si_2H_6$ | 102 | 110 | 113 | 114 | 127 | 130 | 134 |
| Impurity atom doping compound | | | | $B_2H_6$ | | | | |
| Substrate temperature (°C.) | 80 | 80 | 75 | 80 | 75 | 75 | 80 | 80 |
| Dark conductivity $\sigma d\ (\Omega \cdot cm)^{-1}$ | $1 \times 10^{-3}$ | $1 \times 10^{-2}$ | $8 \times 10^{-3}$ | $2 \times 10^{-2}$ | $3 \times 10^{-1}$ | $2 \times 10^{-1}$ | $3 \times 10^{-1}$ | $4 \times 10^{-1}$ |
| Deposition rate (Å/sec) | 12 | 25 | 25 | 25 | 25 | 25 | 25 | 25 |

TABLE 36

| | Comparative Example 6 | Example 66 | 67 | 68 | 69 | 70 | 71 | 72 |
|---|---|---|---|---|---|---|---|---|
| Si compound | $Si_2H_6$ | 102 | 110 | 113 | 114 | 127 | 130 | 134 |
| Impurity atom doping compound | | | | $PH_3$ | | | | |
| Substrate temperature (°C.) | 80 | 80 | 75 | 80 | 75 | 75 | 80 | 80 |
| Dark conductivity $\sigma d\ (\Omega \cdot cm)^{-1}$ | $8 \times 10^{-3}$ | $3 \times 10^{-1}$ | $8 \times 10^{-2}$ | $2 \times 10^{-1}$ | $4 \times 10^{-1}$ | $3 \times 10^{-1}$ | $2 \times 10^{-1}$ | $5 \times 10^{-1}$ |
| Deposition rate (Å/sec) | 12 | 25 | 25 | 25 | 25 | 25 | 25 | 25 |

TABLE 37

| | Comparative Example 7 | Example 73 | 74 | 75 | 76 | 77 | 78 |
|---|---|---|---|---|---|---|---|
| Si compound | $Si_2H_6$ | 101 | 106 | 110 | 111 | 114 | 124 |
| Substrate temperature (°C.) | 90 | 90 | 85 | 75 | 90 | 75 | 90 |
| Rectification ratio[*1] of diode | 7.0 | 7.9 | 8.5 | 7.1 | 8.9 | 8.8 | 9.1 |
| n value of diode | 1.6 | 1.4 | 1.25 | 1.6 | 1.25 | 1.3 | 1.25 |

[*1] A value given by constant logarithm and representing a ratio of forward-bias current to reverse-bias current at 1 V

TABLE 38

| | Example 79 | 80 | 81 | 82 | 83 | 84 | 85 |
|---|---|---|---|---|---|---|---|
| Si compound | 126 | 127 | 130 | 132 | 136 | 138 | 141 |
| Substrate temperature (°C.) | 80 | 75 | 80 | 80 | 75 | 75 | 75 |
| Rectification ratio[*1] of diode | 7.9 | 8.9 | 8.0 | 8.9 | 8.0 | 9.0 | 7.9 |
| n value of diode | 1.4 | 1.25 | 1.3 | 1.25 | 1.4 | 1.25 | 1.5 |

[*1] A value given by constant logarithm and representing a ratio of forward-bias current to reverse-bias current

TABLE 39

|  | Comparative Example 8 | Example 86 | Example 87 | Example 88 | Example 89 | Example 90 | Example 91 |
|---|---|---|---|---|---|---|---|
| Si compound | $Si_2H_6$ | 102 | 106 | 110 | 113 | 114 | 127 |
| Substrate temperature (°C.) | 80 | 80 | 85 | 75 | 80 | 75 | 75 |
| Rectification ratio[*1] of diode | 8.0 | 8.5 | 8.5 | 7.3 | 8.0 | 8.8 | 8.9 |
| n value of diode | 1.5 | 1.25 | 1.25 | 1.6 | 1.4 | 1.25 | 1.25 |

[*1] A value given by constant logarithm and representing a ratio of forward-bias current to reverse-bias current

TABLE 40

|  | Example 92 | Example 93 | Example 94 | Example 95 | Example 96 | Example 97 |
|---|---|---|---|---|---|---|
| Si compound | 130 | 134 | 136 | 138 | 139 | 140 |
| Substrate temperature (°C.) | 80 | 80 | 75 | 75 | 75 | 75 |
| Rectification ratio[*1] of diode | 8.0 | 8.9 | 8.0 | 9.0 | 8.3 | 8.8 |
| n value of diode | 1.3 | 1.25 | 1.4 | 1.25 | 1.4 | 1.3 |

[*1] A value given by constant logarithm and representing a ratio of forward-bias current to reverse-bias current As has been described in detail above, a high-quality deposition film containing silicon can be formed at a high deposition rate even at a low substrate temperature. In addition, even if a film to be deposited has a large area and thick, uniform electrical and optical characteristics can be obtained, thereby guaranteeing the stable product quality unlike the conventional method and device. In addition, since the subtrate need not be heated to a high temperature, energy use can be greatly economised, and a substrate having a poor thermal resistance can be used. Furthermore, the processing steps can be shortened due to a low temperature treatment, and the source compound can be easily prepared. In addition, the cost is low and the stability is excellent, and the handlng is less dangerous.

What is claimed is:

1. A photolytic method of forming a silicon-containing film deposited on a substrate, comprising the steps of forming a gaseous atmosphere of at least one silicon compound selected from the group consisting of compounds represented by general formulas (A), (B), (C), (D), (E) and (F) in a deposition chamber containing the substrate, and applying light energy to the compound sufficient to excite and decompose the compound and to deposit a film while maintaining a pressure of 0.01 to 100 Torr during the forming of said film, whereby the film may be deposited at a substrate temperature on the order of about 50° to 150° C. and without application of thermal energy to excite and decompose the compounds:

(A) $Si_nH_mX_l$ (wherein X is a halogen atom, n is an integer of not less than 3, and m and l are integers of not less than 1 respectively, $m+l=2n$ if l is an integer of not less than 2, a plurality of X's may represent different halogen atoms) representing a cyclic silicon compound;

(B) $Si_aX_{2a+2}$ (wherein X is halogen atom and a is an integer of 1 to 6) representing a chain halogenated silicon compound;

(C) $Si_bX_{2b}$ (wherein x is a halogen atom and b is an integer of 3 to 6) representing a cyclic halogenated silicon compound;

(D) $Si_cX_dY_e$ (wherein X and Y are different halogen atoms, c is an integer of 3 to 6, d and e are integers of not less than 1, and $d+e=2c$) representing a cyclic halogenated silicon compound;

(E) $Si_fX_gY_h$ (wherein X and Y are different halogen atoms, f is an integer of 1 to 6, g and h are integers of not less than 1, and $g+h=2f+2$) representing a chain halogenated silicon compound; and (F) $Si_iH_jX_k$ (wherein X is a halogen atom, i, j and k are integers of not less than 1, and $j+k=2i+2$) representing a silicon compound.

2. A method according to claim 1, wherein the silicon compound comprises a cyclic silicon compound represented by general formula $Si_nH_mX_l$ (wherein X is a halogen atom, n is an integer of not less than 3, m and l are integers of not less than 1, and $m+l=2n$; if l is an integer of not less than 2, a plurality of X's may be different halogen atoms).

3. A method according to claim 1, wherein the silicon compound comprises a chain halogenated silicon compound represented by general formula $Si_aX_{2a+2}$ (wherein X is a halogen atom and a is an integer of 1 to 6).

4. A method according to claim 1, wherein the silicon compound comprises a cyclic halogenated silicon compound represented by general formula $Si_bX_{2b}$ (wherein X is a halogen atom and b is an integer of 3 to 6).

5. A method according to claim 1, wherein the silicon compound comprises a cyclic halogenated silicon compound represented by general formula $Si_cX_dY_e$ (wherein X and Y are different halogen atoms, c is an integer of 3 to 6, d and e are integers of not less than 1, and $d+e=2c$).

6. A method according to claim 1, wherein the silicon compound comprises a chain halogenated silicon compound represented by general formula $Si_fX_gY_h$ (wherein X and Y are different halogen atoms, f is an integer of 1 to 6, g and h are respectively integers of not less than 1, and $g+h=2f+2$).

7. A method according to claim 1, wherein the silicon compound comprises a silicon compound represented by general formula $Si_iH_jX_k$ (wherein X is a halogen atom, i, j and k are integers of not less than 1, and $j+k=2i+2$).

8. A method according to claim 1, wherein hydrogen is further supplied to the chamber.

9. A method according to claim 1, wherein a compound containing an element selected from the group consisting of Groups III and V elements of the Periodic Table is further supplied to the chamber.

10. A method according to claim 9, wherein the Group III element is an element selected from the group consisting of B, Al, Ga, In and Tl.

11. A method according to claim 9, wherein the Group V element is an element selected from the group consisting of N, P, As, Sb and Bi.

12. A method according to claim 1, wherein the light energy is a member selected from the group consisting of ultraviolet rays, infrared rays, visible light rays, X-rays and gamma-rays.

13. A method according to claim 1, wherein said light energy generating means is a light source selected from the group consisting of a mercury lamp, a xenon lamp, a carbon dioxide laser, an argon ion laser and an excimer laser.

14. A method according to claim 2, wherein the silicon compound is a compound selected from the group consisting of:

(1) $H_6Si_6F_6$; (2) $H_6Si_6Cl_6$; (3) $H_6Si_6Br_6$; (4) $H_6Si_6I_6$; (5) $H_6Si_6F_4Br_2$; (6) $H_6Si_6Cl_4Br_2$; (7) $H_8Si_6F_4$; (8) $H_8Si_6Cl_4$; (9) $H_8Si_6Br_4$; (10) $H_8Si_6I_4$; (11) $H_5Si_5F_5$; (12) $H_5Si_5Cl_5$; (13) $H_5Si_5Br_5$; (14) $H_5Si_5I_5$; (15) $H_5Si_5F_3Br_2$; (16) $H_5Si_5Cl_3Br_2$; (17) $H_6Si_5F_4$; (18) $H_6Si_5Cl_4$; (19) $H_6Si_5Br_4$; (20) $H_6Si_5I_4$; (21) $H_4SiF_4$; (22) $H_4Si_4Cl_4$; and (23) $H_4Si_4Br_4$.

15. A method according to claim 3, wherein the silicon compound is a compound selected from the group consisting of:

(24) $SiF_4$; (25) $Si_2F_6$; (26) $Si_3F_8$; (27) $Si_4F_{10}$; (28) $Si_5F_{12}$; (29) $Si_6F_{14}$; (30) $SiCl_4$; (31) $Si_2Cl_6$; (32) $Si_3Cl_8$; (33) $SiBr_4$; (34) $Si_2Br_6$; (35) $Si_3Br_8$; and (36) $SiI_4$.

16. A method according to claim 4, wherein the silicon compound is a compound selected from the group consisting of:

(37) $Si_3F_6$; (38) $Si_4F_8$; (39) $Si_5F_{10}$; (40) $Si_6F_{12}$; (41) $Si_3Cl_6$; (42) $Si_4Cl_8$; (43) $Si_5Cl_{10}$; (44) $Si_6Cl_{12}$; (45) $Si_3Br_6$; and (46) $Si_4Br_8$.

17. A method according to claim 5, wherein the silicon compound is a compound selected from the group consisting of:

(47) $Si_3F_5Cl$; (48) $Si_3F_4Cl_2$; (49) $Si_3F_3Cl_3$; (50) $Si_3F_2Cl_4$; (51) $Si_3FCl_5$; (52) $Si_4F_7Cl$; (53) $Si_4F_6Cl_2$; (54) $Si_4F_5Cl_3$; (55) $Si_4F_4Cl_4$; (56) $Si_4F_3Cl_5$; (57) $Si_4F_2Cl_6$; (58) $Si_4FCl_7$; (59) $Si_3F_5Br$; (60) $Si_3F_4Br_2$; (61) $Si_3F_3Br_3$; (62) $Si_3F_2Br_4$; (63) $Si_3FBr_5$; (64) $Si_4F_7Br$; (65) $Si_4F_6Br_2$; (66) $Si_4F_5Br_3$; (67) $Si_4F_4Br_4$; (68) $Si_4F_3Br_5$; (69) $Si_4F_2Br_6$; (70) $Si_4FBr_7$; (71) $Si_3Cl_5Br$; (72) $Si_3Cl_4Br_2$; (73) $Si_3Cl_3Br_3$; (74) $Si_3Cl_2Br_4$; (75) $Si_3ClBr_5$; (76) $Si_3F_5I$; (77) $Si_3F_4I_2$; and (78) $Si_3F_3I_3$.

18. A method according to claim 6, wherein the silicon compound is a compound selected from the group consisting of:

(79) $SiF_3Cl$; (80) $SiF_2Cl_2$; (81) $SiFCl_3$; (82) $Si_2FCl_5$; (83) $Si_2F_2Cl_4$; (84) $Si_2F_3Cl_3$; (85) $Si_2F_4Cl_2$; (86) $Si_2F_5Cl$; (87) $Si_3F_7Cl$; (88) $Si_3F_6Cl_2$; (89) $Si_3F_5Cl_3$; (90) $SiF_3Br$; (91) $SiF_2Br_2$; (92) $SiFBr_3$; (93) $Si_2F_5Br$; (94) $Si_2F_4Br_2$; (95) $Si_2F_3Br_3$; (96) $SiCl_3Br$; (97) $SiCl_2Br_2$; (98) $SiClBr_3$; (99) $SiF_3I$; and (100) $SiF_2I_2$.

19. A method according to claim 1, wherein the silicon compound is at least one compound selected from the group consisting of:

(101) $H_2SiBr_2$; (102) $H_2SiI_2$; (103) $H_3SiF$; (104) $H_3SiBr$; (105) $H_3SiI$; (106) $H_3SiFI$; (107) $H_2SiClI$; (108) $H_2SiBrI$; (109) $(HBr_2Si)_2$; (110) $(HI_2Si)_2$; (111) $(H_2FSi)_2$; (112) $(H_2ClSi)_2$; (113) $(H_2BrSi)_2$; (114) $(H_2ISi)_2$; (115) $H_4Si_2FI$; (116) $H_4Si_2ClI$; (117) $H_4Si_2BrI$; (118) $H_4Si_2FBr$; (119) $H_4Si_2ClBr$; (120) $H_5Si_2F$; (121) $H_5Si_2Cl$; (122) $H_5Si_2Br$; (123) $H_5Si_2I$;

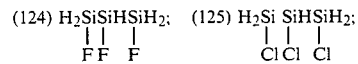

(126) $H_5Si_3Br_3$; (127) $H_5Si_3I_3$; (128) $H_4Si_3Br_4$; (129) $H_4Si_3I_4$; (130) $H_6Si_3Br_2$; (131) $H_6Si_3I_2$; (132) $H_7Si_3F$; (133) $H_7Si_3Cl$; (134) $H_7Si_3Br$; (135) $H_7Si_3I$; (136) cyc-$H_2Si_6Br_{10}$; (137) cyc-$H_6Si_6Br_6$; (138) cyc-$H_2Si_6F_4Br_6$; (139) cyc-$H_6Si_6Cl_6$; (140) cyc-$H_6Si_6F_6$; and (141) cyc-$H_2Si_6F_{10}$.

20. A method according to claim 1 including maintaining the substrate at a temperature from about 50° to 150° C. during film formation.

* * * * *

UNITED STATES PATENT AND TRADEMARK OFFICE
CERTIFICATE OF CORRECTION

PATENT NO. : 4,683,147
DATED : July 28, 1987
INVENTOR(S) : KEN EGUCHI, ET AL.

It is certified that error appears in the above-identified patent and that said Letters Patent is hereby corrected as shown below:

AT [57] IN THE ABSTRACT

Line 7, "exite" should read --excite--.
Line 23, "$Si_fY_gY_h$" should read --$Si_fX_gY_h$--.
Line 27, "i,j" should read --i, j--.

COLUMN 1

Line 30, "in addition" should read --In addition--.
Line 45, "fomred" should read --formed--.

COLUMN 2

Line 54, "irradiation" should read --irradiating--.

COLUMN 3

Line 8, "g+h=B 2f+2)" should read --g+h=2f+2)--.
Line 38, "referring a-Si" should read --referring to a-Si--.
Line 51, "atoms 8" should read --atoms is 8--.
Line 62, "in" should read --is--.

COLUMN 4

Lines 30-31, "stable.¶ In" should read --stable.  In--.
Line 43, "(B32) $Si_3Cl_8$;" should read --(32) $Si_3CL_8$;--.

COLUMN 6

Line 1, "(81) $SiF_3Cl$" should read --(81) $SiFCl_3$--.

UNITED STATES PATENT AND TRADEMARK OFFICE
CERTIFICATE OF CORRECTION

PATENT NO. : 4,683,147

DATED : July 28, 1987

INVENTOR(S) : KEN EGUCHI, ET AL.

It is certified that error appears in the above-identified patent and that said Letters Patent is hereby corrected as shown below:

COLUMN 7

Line 11, "relative" should read --relatively--.

COLUMN 8

Line 1, "as" should read --an--.
    Line 6, "$P_2H_4$." should read --$P_2H_4$,--.
    Line 7, "$BF_3$ $BCl_3$," should read --$BF_3$, $BCl_3$,--.

COLUMN 9

Line 25, "$5 \times 10^4 \overset{c}{A}$" should read --$5 \times 10^4 \overset{\circ}{A}$--.
    Line 53, "of" should read --or--.

COLUMN 10

Line 23, "$5 \times 10^4 \overset{\circ}{A}$" should read --$5 \times 10^4 \overset{\circ}{A}$--.
    Line 27, "as a" should read --as at a--.
    Line 49, "substrate" should read --pressure--.
    Line 53, "a" should read --the--.

COLUMN 11/TABLE 2

Line 31, "$10^{-1}$" should read --$10^{-5}$--.

COLUMN 12

Line 52, "cpompared" should read --compared--.

COLUMN 14

Line 26, "p" should read --n--.

UNITED STATES PATENT AND TRADEMARK OFFICE
CERTIFICATE OF CORRECTION

PATENT NO. : 4,683,147

DATED : July 28, 1987

INVENTOR(S) : KEN EGUCHI, ET AL.

It is certified that error appears in the above-identified patent and that said Letters Patent is hereby corrected as shown below:

COLUMN 15

Line 10, "which then" should read --which was then--.

COLUMN 16

Line 22, "$\rho d$" should read --$\sigma d$--.

COLUMN 18

Line 50, "evan" should read --even--.

COLUMN 20

Line 37, "didode" should read --diode--.

COLUMN 21

Line 58, "a-si" should read --a-Si--.

COLUMN 23

Line 40, "as" should read --of the--.

COLUMN 24/TABLE 23

Line 12, "esp" should read --exp--.

COLUMN 25

Line 63, "apparatus" should read --temperatures--.

UNITED STATES PATENT AND TRADEMARK OFFICE
CERTIFICATE OF CORRECTION

PATENT NO. : 4,683,147
DATED : July 28, 1987
INVENTOR(S) : KEN EGUCHI, ET AL.

It is certified that error appears in the above-identified patent and that said Letters Patent is hereby corrected as shown below:

COLUMN 26

Line 14, "$\Sigma d$" should read --$\sigma d$--.

COLUMN 28

Line 51, "I-type" should read --i-type--.

COLUMN 31

Line 52, "n-type film" should read --n-type a-Si film--.

COLUMN 33

Line 10, "n value" should read --$\eta$ value (both occurrences)--.
Line 11, "$J=J\{\exp(eV/nkT)-1\}$" should read --$J=J_S\{\exp(eV/\eta kT)-1\}$--.

COLUMN 34

Line 11, "are" should read --were--.
Line 17, "procedure" should read --procedures--.
Line 22, "procedure" should read --procedures--.
Line 34, "they expressed" should read --they were expressed--.

COLUMN 35/TABLE 37

Line 50, "n value" should read --$\eta$ value--.

UNITED STATES PATENT AND TRADEMARK OFFICE
CERTIFICATE OF CORRECTION

PATENT NO. : 4,683,147
DATED : July 28, 1987
INVENTOR(S) : KEN EGUCHI, ET AL.

It is certified that error appears in the above-identified patent and that said Letters Patent is hereby corrected as shown below:

COLUMN 35/TABLE 38

Line 64, "n value" should read --$\eta$ value--.

COLUMN 37/TABLE 39

Line 12, "n value" should read --$\eta$ value--.

COLUMN 37/TABLE 40

Line 25, "n value" should read --$\eta$ value--.

COLUMN 37

Line 37, "subtrate" should read --substrate--.
Line 44, "handlng" should read --handling--.
Line 62, "m+l=2n if" should read --m+l=2n; if--.

COLUMN 38

Line 16, "x" should read --X--.

UNITED STATES PATENT AND TRADEMARK OFFICE
CERTIFICATE OF CORRECTION

PATENT NO. : 4,683,147

DATED : July 28, 1987

INVENTOR(S) : KEN EGUCHI, ET AL.

It is certified that error appears in the above-identified patent and that said Letters Patent is hereby corrected as shown below:

COLUMN 40

Line 11, "(81) $SiF_3Cl$" should read --(81) $SiFCl_3$--.
Line 40, "1 including" should read --1, including--.

Signed and Sealed this

Twenty-sixth Day of April, 1988

Attest:

DONALD J. QUIGG

Attesting Officer

Commissioner of Patents and Trademarks